United States Patent
Yang et al.

(10) Patent No.: US 9,921,495 B2
(45) Date of Patent: Mar. 20, 2018

(54) MAGNETIC SENSOR CALIBRATION AND SERVO FOR PLANAR MOTOR STAGE

(71) Applicant: NIKON CORPORATION, Tokyo (JP)

(72) Inventors: Pai-Hsueh Yang, Palo Alto, CA (US); Michael Binnard, Belmont, CA (US); J. Kyle Wells, San Bruno, CA (US); Chetan Mahadeswaraswamy, San Francisco, CA (US); Tsutomu Ogiwara, Saitama-ken (JP)

(73) Assignee: NIKON CORPORATION (JP)

( * ) Notice: Subject to any disclaimer, the term of this patent is extended or adjusted under 35 U.S.C. 154(b) by 253 days.

(21) Appl. No.: 14/158,563

(22) Filed: Jan. 17, 2014

(65) Prior Publication Data
US 2014/0204358 A1 Jul. 24, 2014

Related U.S. Application Data

(60) Provisional application No. 61/755,658, filed on Jan. 23, 2013.

(51) Int. Cl.
| | |
|---|---|
| *G03B 27/58* | (2006.01) |
| *G03F 7/20* | (2006.01) |
| *H02K 41/03* | (2006.01) |

(52) U.S. Cl.
CPC ........ *G03F 7/70775* (2013.01); *G03F 7/7085* (2013.01); *G03F 7/70758* (2013.01); *H02K 41/031* (2013.01); *H02K 2201/18* (2013.01)

(58) Field of Classification Search
CPC .. G03F 7/70691; G03F 7/707; G03F 7/70708; G03F 7/70716; G03F 7/70725; G03F 7/70758; G03F 7/70775; G03F 7/7085; H02K 41/031; H02K 41/033; H02K 2201/18
USPC ............... 355/52, 53, 55, 72–77; 310/12.06; 250/492.1, 492.2, 492.22, 493.1; 318/135, 568.16, 400.37, 400.38, 400.4, 318/467
See application file for complete search history.

(56) References Cited

U.S. PATENT DOCUMENTS

| | | | | |
|---|---|---|---|---|
| 5,925,956 | A * | 7/1999 | Ohzeki | F16C 29/00 310/12.06 |
| 6,327,026 | B1 * | 12/2001 | Wakui | G03F 7/707 355/53 |
| 2002/0079888 | A1 * | 6/2002 | Frissen | H02K 41/031 324/207.2 |
| 2004/0007920 | A1 * | 1/2004 | Teng | H02P 6/006 310/12.06 |

(Continued)

*Primary Examiner* — Christina Riddle
(74) *Attorney, Agent, or Firm* — Reoder & Broder LLP; Steven G. Roeder

(57) ABSTRACT

A stage assembly for positioning a device includes: (i) a stage that retains the device; (ii) a base; (iii) a mover assembly that moves the stage along a first axis, along a second axis, and along a third axis relative to the base; (iv) a magnetic sensor system that monitors the movement of the stage along the first, second and third axes, the magnetic sensor system generating a magnetic sensor signal; (v) a second sensor system that monitors the movement of the stage along the first, second and third axes, the second sensor system generating a second sensor signal; and (vi) a control system that controls the mover assembly using at least one of the magnetic sensor signal and the second sensor signal.

23 Claims, 23 Drawing Sheets

(56) References Cited

U.S. PATENT DOCUMENTS

| | | | |
|---|---|---|---|
| 2008/0203828 A1* | 8/2008 | Compter | G03F 7/70758 310/12.06 |
| 2008/0285005 A1* | 11/2008 | Gery | G03B 27/58 355/72 |
| 2011/0208459 A1* | 8/2011 | Butler | G03F 7/70516 702/94 |
| 2012/0262157 A1* | 10/2012 | Liebart | G01D 5/145 324/207.2 |
| 2013/0069449 A1* | 3/2013 | Pharand | H02K 41/031 310/12.02 |

\* cited by examiner

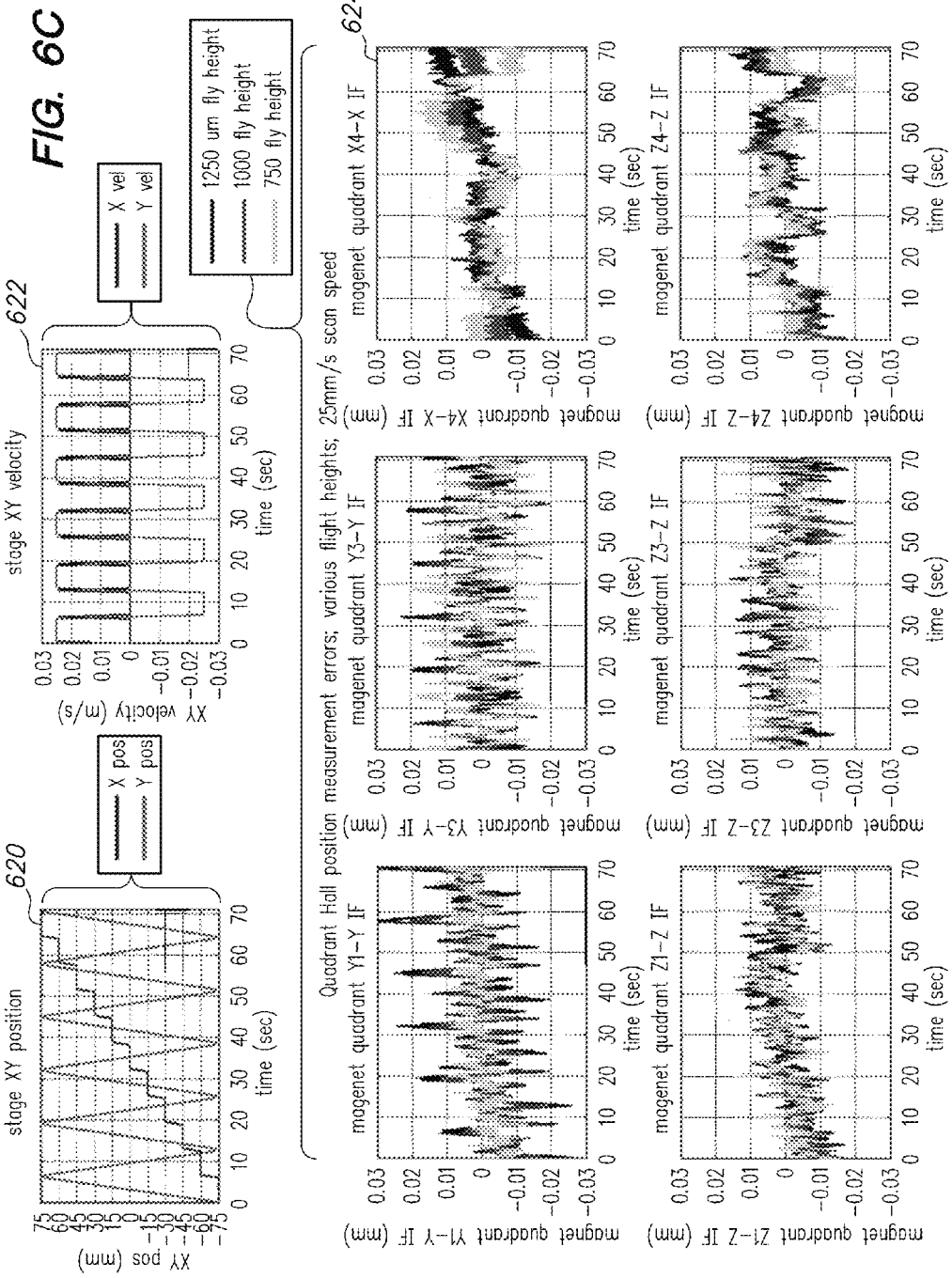

MAGNETIC SENSOR CALIBRATION AND SERVO FOR PLANAR MOTOR STAGE

RELATED APPLICATION

The present application claims priority on U.S. Provisional Ser. No. 61/755,658, filed Jan. 23, 2013, and entitled "HALL SENSOR CALIBRATION AND SERVO FOR PLANAR MOTOR STAGE". As far as permitted, the contents of U.S. Provisional Ser. No. 61/755,658 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains and positions a reticle, a lens assembly, a wafer stage assembly that retains and positions a semiconductor wafer, and a measurement system that monitors the position or movement of the reticle and the wafer.

SUMMARY

The present invention is directed to stage assembly for positioning a device along a first axis, along a second axis, and along a third axis. In one embodiment, the stage assembly includes: (i) a stage that retains the device; (ii) a base; (iii) a mover assembly that moves the stage along the first, second and third axes; (iv) a magnetic sensor system that monitors the movement of the stage along the first, second and third axes, the magnetic sensor system generating a magnetic sensor signal; (v) a second sensor system that monitors the movement of the stage along the first, second and third axes, the second sensor system generating a second sensor signal; and (vi) a control system that controls the mover assembly using at least one of the magnetic sensor signal and the second sensor signal. In one embodiment, the magnetic sensor is a hall sensor.

For example, the second sensor system can be an interferometer system or an encoder system. In certain embodiments, the control system uses the second sensor system as the primary measurement system, and the control system uses the magnetic sensor system during initialization of the stage and/or when the second sensor signal is lost.

In one embodiment, the control system utilizes the second sensor signal to calibrate the magnetic sensor signal. As provided herein, the magnetic sensor system can be calibrated using at least one of the following calibrations: (i) sensor decoupling from the coil flux; (ii) sensor offset removal and gain equalization; (iii) Quadrant Z gain calibrations; and/or (iv) correction maps for XZ and YZ quadrant positions.

The stage mover can be a planar motor that includes a magnet assembly that is secured to the stage, and a conductor assembly that is secured to the base. The magnetic sensors measure the magnetic fields from the magnets of the magnet assembly. The conductor assembly includes a plurality of coils and the magnetic sensors can be positioned below the coils. In one embodiment, each magnetic sensor is positioned directly (or not directly) below one of the coils, offset from a center of the coil to reduce the influence of the flux generated by the current thru the coils.

In certain embodiments, the problem of losing a valid interferometer or encoder signals during stage initialization or operation causing serious stage controllability issues is solved by servoing the stage with well-calibrated Magnetic sensors. The interferometer and encoder may provide very accurate measurement down to nanometers or sub-nanometers. However, such sensors are incremental and require good alignments and environmental control. During stage initialization or regular operations, valid interferometer and encoder signals sometimes may become unavailable due to some practical reasons. In such cases, the stage may be servoed with Magnetic sensors, which sense the magnetic flux strength of motor magnet arrays of planar motor stage. In certain embodiments, for the Magnetic sensors to measure the stage position correctly, proper calibrations need be conducted beforehand. The proposed calibrations lead to the successful application of Magnetic sensors to six degree of freedom stage control.

Once the magnetic sensor system is properly calibrated, the magnetic sensors may be used in the initial stage servo before switching to more accurate interferometer or encoder servo. Further, the magnetic sensors may be used to servo the stage and maintain its stability in the event the stage loses the encoder or interferometer signal during trajectory motion.

The present invention is also directed to a stage assembly, an exposure apparatus, a device manufactured with the exposure apparatus, and/or a wafer on which an image has been formed by the exposure apparatus. Further, the present invention is also directed to a method for controlling and moving a stage, a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIGS. 6A, 6B, 6C, and 6D include graphs for the discussion related to the quadrant correction map;

DESCRIPTION

Figure 1A:
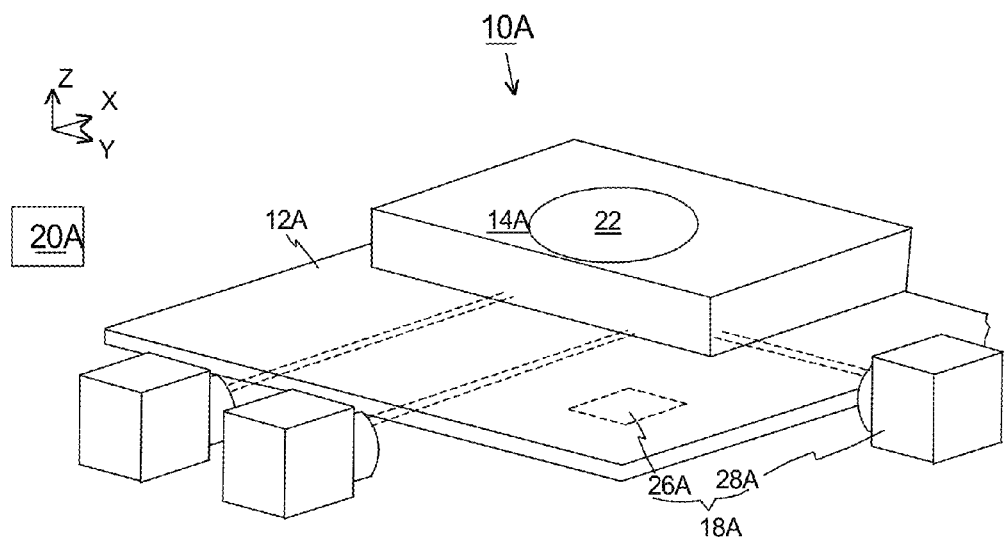
FIG. 1A is a simplified perspective view of a stage assembly having features of the present invention.

FIG. 1A is a simplified perspective illustration of a stage assembly 10A that includes a base 12A, a stage 14A, a stage mover assembly 16 (not shown in FIG. 1A), a measurement system 18A, and a control system 20A (illustrated as a box). The design of each of these components can be varied to suit the design requirements of the stage assembly 10A. The stage assembly 10A is particularly useful for precisely positioning a device 22 during a manufacturing and/or an inspection process. The type of device 22 positioned and moved by the stage assembly 10A can be varied. For example, the device 22 can be a semiconductor wafer, or a reticle, and the stage assembly 10A can be used as part of an exposure apparatus for precisely positioning the wafer or the reticle during manufacturing of the semiconductor wafer. Alternatively, for example, the stage assembly 10A can be used to move other types of devices during manufacturing and/or inspection, to move a device under an electron microscope (not shown), or to move a device during a precision measurement operation (not shown).

As an overview, in certain embodiments, the measurement system 18A utilizes both a magnetic sensor system 26A (e.g. a hall sensor system, only a portion is illustrated in phantom), and a second sensor system 28A (only a portion is shown in the Figures) that cooperate to monitor the position of the stage 14A. In certain embodiments, the second sensor system 28A (only a portion is shown in FIG. 1A) is used in the primary control of the stage mover assembly 16. Further, in certain embodiments, the magnetic sensor system 26A can be used during system initialization and/or when the signal from the second system 28A is lost. Many times during initialization of the stage assembly 10A, the angle of the stage 14A is too much to get an accurate measurement with the second sensor system 28A. Further, water or other environmental factors can block the signal from the second sensor system 28A or the stage 14A can be moved out of the range of the second sensor system 28A. At these times, the magnetic sensor system 26A can be used to control the stage mover assembly 16. Further, the magnetic sensor system 26A can be used when less accuracy is required.

Moreover, in certain embodiments, the second sensor system 28A can be used to improve the accuracy of the magnetic sensor system 26A. For example, the second sensor system 28A can be used to calibrate the magnetic sensor system 26A.

Some of the Figures provided herein include an orientation system that designates an X axis, a Y axis, and a Z axis. It should be understood that the orientation system is merely for reference and can be varied. For example, the X axis can be switched with the Y axis and/or the stage assembly 10A can be rotated. Moreover, these axes can alternatively be referred to as a first, second, or third axis.

In the embodiments illustrated herein, the stage assembly 10A includes a single stage 14A that retains the device 22. Alternately, for example, the stage assembly 10A can be designed to include multiple stages that are independently moved and monitored with the measurement system 18A.

The base 12A is coupled to the stage mover assembly 16, receives the reaction forces generated by the stage mover assembly 16, and can be any suitable structure. In FIG. 1A, the base 12A is generally rectangular shaped and is rigid. In certain embodiments, the base 12A can be a reaction assembly that counteracts, reduces and minimizes the influence of the reaction forces from the stage mover assembly 16 on the position of other structures. For example, the base 12A can be a rigid, rectangular shaped countermass that is maintained above a countermass support (not shown) with a reaction bearing (not shown) that allows for motion of the base 12A relative to the countermass support along the X axis, along the Y axis and about the Z axis. For example, the reaction bearing can be a vacuum preload type fluid bearing, a magnetic type bearing, or a roller bearing type assembly. Alternatively, for example, the stage assembly 10A can include a reaction frame (not shown), that couples the stage mover assembly 16 to the base 12A or another structure.

With the present design, (i) movement of the stage 14A with the stage mover assembly 16 along the X axis, generates an equal and opposite X reaction force that moves the base 12A in the opposite direction along the X axis; (ii) movement of the stage 14A with the stage mover assembly 16 along the Y axis, generates an equal and opposite Y reaction force that moves the base 12A in the opposite direction along the Y axis; and (iii) movement of the stage 14A with the stage mover assembly 16A about the Z axis generates an equal and opposite theta Z reaction moment (torque) that moves the base 12A about the Z axis. Additionally, any motion of the stage 14A with respect to the base 12A when away from the center of mass of the base 12A will tend to produce a reaction moment in Z direction on base 12A that will tend to rotate the base 12A about the Z axis.

The stage 14A retains the device 22. In one embodiment, the stage 14A is precisely moved by the stage mover assembly 16 to precisely position the stage 14A and the device 22. In FIG. 1A, the stage 14A is generally rectangular shaped and includes a device holder (not shown) for retaining the device 22. The device holder can be a vacuum chuck, an electrostatic chuck, or some other type of clamp.

The measurement system 18A monitors the movement and/or the position of the stage 14A relative to a reference, such as an optical assembly (not shown in FIG. 1A). With this information, the stage mover assembly 16 can be controlled by the control system 20A to precisely position the stage 14A. As provided herein, in certain embodiments, the measurement system 18A utilizes (i) the magnetic sensor system 26A that monitors the movement of the stage 14A, and (ii) the second sensor system 28A that also monitors the movement of the stage 14A. The design of the measurement system 18A can be varied according to the movement requirements of the stage 14A.

In the non-exclusive embodiment illustrated in FIG. 1A, the stage mover assembly 16 moves the stage 14A along the X, Y, and Z axes, and about the X, Y, and Z axes (six degrees of freedom). In this embodiment, the magnetic sensor system 26A monitors the movement or position of the stage 14A along the X, Y, and Z axes, and about the X, Y, and Z axes (six degrees of freedom); and the second sensor system 28A monitors the movement or position of the stage 14A along the X, Y, and Z axes, and about the X, Y, and Z axes (six degrees of freedom).

Alternatively, the stage mover assembly 16 can be designed to only move the stage 14A along the X and Y axes, and about Z axis (planar degrees of freedom). In this embodiment, the magnetic sensor system 26A and the second sensor system 28A each monitor the movement of the stage 14A along the X and Y axes, and about Z axis.

The design of the second sensor system 28A can vary. In the embodiment illustrated in FIG. 1A, the second sensor system 28A is an interferometer system.

The control system 20A is electrically connected to the measurement system 18A, and utilizes the second sensor signals from the second sensor system 28A and/or the magnetic sensor signals from the magnetic sensor system 26A to monitor the movement of the stage 14A. The control system 20A is also electrically connected to, directs and controls electrical current to the stage mover assembly 16 to precisely position the device 22. With information regarding the movement or position of the stage 14A, the control system 20A can direct current to the stage mover assembly 16 so that the stage 14A follows the desired trajectory. The control system 20 can include one or more processors.

Figure 1B:
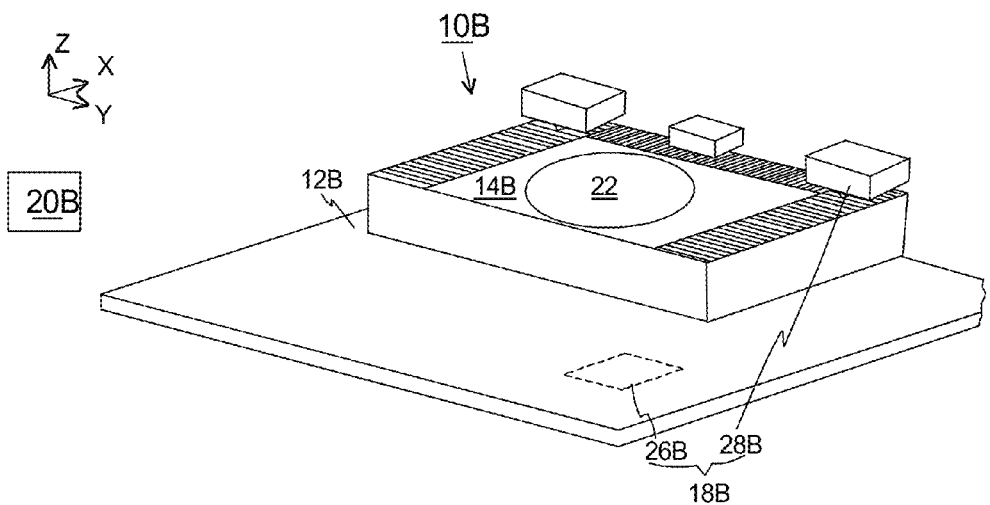
FIG. 1B is a simplified perspective view of another embodiment of a stage assembly having features of the present invention.

FIG. 1B is a simplified perspective illustration of another embodiment of the stage assembly 10B that includes a stage 12B, a stage 14B, a stage mover assembly 16 (not shown in FIG. 1B), and a control system 20B (illustrated as a box) that are similar to the corresponding components described above in reference to FIG. 1A. However, in this embodiment, the measurement system 18B is slightly different. More specifically, in this embodiment, the measurement system 18B again includes a magnetic sensor system 26B (only a portion illustrated in FIG. 1B), and a second sensor system 28B (only a portion illustrated in FIG. 1B). However, in this embodiment, the second sensor system 28B is an encoder assembly that includes one or more encoders that monitor the movement of the stage 12B along and about the first, second and third axes.

Figure 1C:
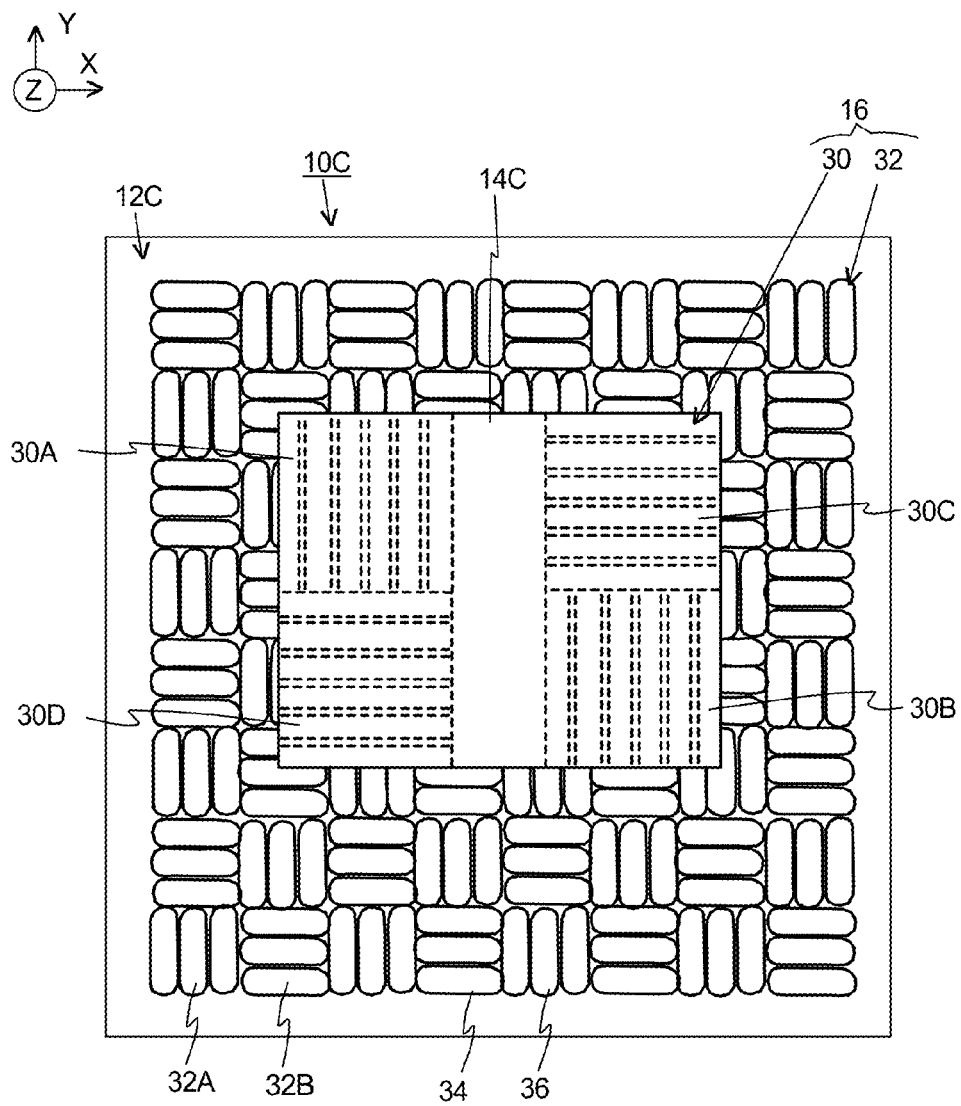
FIG. 1C is a top plan view of a portion of a stage assembly having features of the present invention.

FIG. 1C is a top plan view of a portion of the stage assembly 10C having features of the present invention that illustrates the base 12C, the stage 14C, and the stage mover assembly 16. The stage mover assembly 16 moves and positions of the stage 14C relative to the stage base 12C. The design of the stage mover assembly 16 can be varied to suit the movement requirements of the stage assembly 10C. For example, the stage mover assembly 16 can be designed to move the stage 14C with six degrees of freedom relative to the base 12C.

Alternatively, the stage mover assembly 16 can be designed to move the stage 14C with less than six degrees of freedom. For example, the stage mover assembly 16 can be designed to move the stage 14C along the X axis, along the Y axis, and about the Z axis (collectively "the planar degrees of freedom") relative to the stage base 12C. In this embodiment, a fluid bearing or another type of bearing (e.g. a magnetic bearing) can support the stage 14C above the stage base 12C while allowing for movement of the stage 14C relative to the stage base 12C in the planar degrees of freedom.

In FIG. 1C, the stage mover assembly 16 is a planar motor that includes a magnet assembly 30 (illustrated in phantom), and a conductor assembly 32. Further, (i) the conductor assembly 32 can include a plurality of first axis conductor units 32A (sometimes referred to as "X conductor units"), and a plurality of second axis conductor units 32B (sometimes referred to as "Y conductor units"); and (ii) the magnet assembly 30 can include a pair of spaced apart, first axis magnet arrays 30A, 30B (sometimes referred to as "a first X magnet array 30A and a second X magnet array 30B"), and a pair of spaced apart, second axis magnet arrays 30C, 30D (sometimes referred to as "a first Y magnet array 30C and a second Y magnet array 30D").

Each first axis magnet array 30A, 30B includes a plurality of first axis magnets (sometimes referred to as "X magnets"), and the second axis magnet array 30C, 30D includes a plurality of second axis magnets (sometimes referred to as "Y magnets"). Further, the number of magnets in the arrays can vary. In one embodiment, (i) each X magnet array 30A, 30B includes six X magnets that extend along the Y axis and that are spaced apart along the X axis; and (ii) each Y magnet array 30C, 30D includes six Y magnets that extend along the X axis and that are spaced apart along the Y axis.

In one embodiment, the X magnets in each X magnet array 30A, 30B are arranged so that X magnets alternate with the North pole and the South pole facing the conductor array as you move along the X axis. Similarly, the Y magnets in each Y magnet array 30C, 30D are arranged so that Y magnets alternate with the North pole and the South pole facing the conductor array as you move along the Y axis. With this design, each magnet array has a substantially sinusoidal magnetic flux. In certain embodiments, the spaces between adjacent magnets is filled with additional magnets (not shown) with a horizontal or diagonal magnetization direction to form a Halbach magnet array, as is well-known to those skilled in the art. As provided herein, each magnet array 30A, 30B, 30C, 30D has a magnetic pitch that is defined by the distance between adjacent North (or South) poles. As one non-exclusive example, each magnet can be made of a permanent magnetic material such as NdFeB.

In the non-exclusive embodiment illustrated in FIG. 1C, the conductor assembly 32 is a checkerboard pattern with the X conductor units 32A arranged in an alternating fashion with the Y conductor units 32B along the X axis and along the Y axis. Stated in another fashion, the conductor assembly 32 is organized as a grid that includes eight columns (aligned with the Y axis) of conductor units 32A, 32B. Further, in each column, the X conductor units 32A are alternately interspersed with the Y conductor units 32B. Moreover, the conductor units 32A, 32A are all in the same Z plane.

Each conductor unit 32A, 32B includes one or more conductors. In FIG. 1C, (i) each X conductor unit 32A includes three, adjacent, X conductors 34 that are aligned side by side along the X axis; and (i) each Y conductor unit 32B includes three, adjacent, Y conductors 36 that are aligned side by side along the Y axis. With this design, a plurality of first axis conductors 34 form a three phase motor with the first axis magnet arrays 30A, 30B, and a plurality of second axis conductors 36 form a three phase motor with the second axis magnet arrays 30C, 30D.

Further, each conductor 34, 36 can be substantially oval shaped, i.e. a race track type conductor. Moreover, each conductor 34, 36 can be made by coiling a metal wire such as copper or any substance or material responsive to electrical current and capable of creating a magnetic field such as superconductors. Other conductor shapes which are known in the use of linear and planar motors can also be used in alternative embodiments.

Figure 2A:
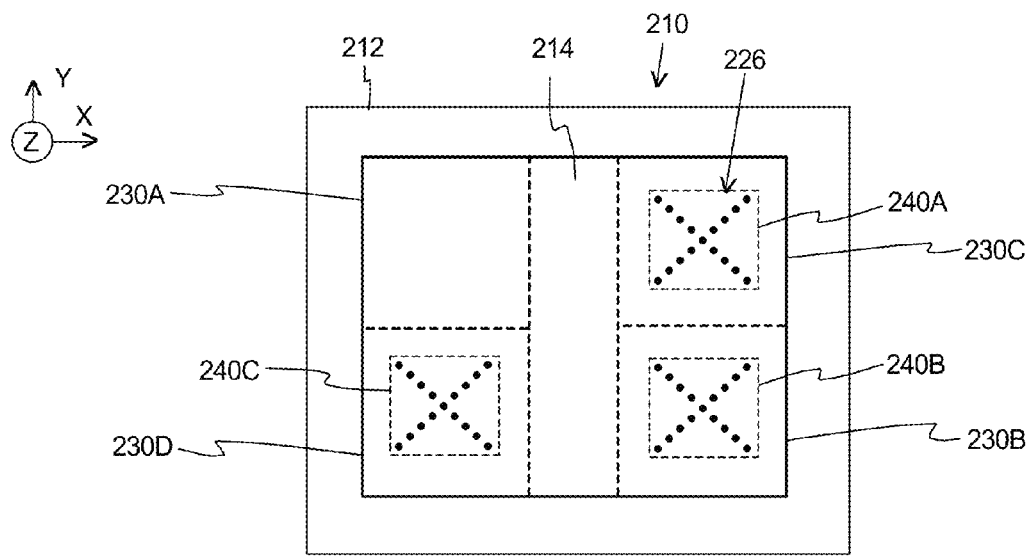
FIG. 2A is a simplified illustration of a stage assembly.

FIG. 2A is a simplified illustration of a portion of a stage assembly 210 including the base 212, the stage 214, and the magnetic sensor system 226. The first X magnet array 230A (XZ2), the second X magnet array 230B (XZ4), the first Y magnet array 230C (YZ1), and the second Y magnet array 230D (YZ3) are illustrated as an outline in FIG. 2A in phantom because they are positioned below the stage 214.

The design of the magnetic sensor system 226 can vary pursuant to the teachings provided herein. In FIG. 2A, the magnetic sensor system 226 includes at least three separate, and spaced apart magnetic sensor groups 240A, 240B, 240C (illustrated in phantom because they are located below the stage 214) that are secured to the base 212. In this embodiment, each of the magnetic sensor groups 240A, 240B, 240C is designed to monitor the position or movement of the stage 14 along two axes. More specifically, the magnetic sensor system 226 includes (i) a first (YZ) magnetic sensor group 240A that monitors the position or movement of the stage 214 along the Y and Z axes; (ii) a second (XZ) magnetic sensor group 240B that monitors the position or movement of the stage 214 along the X and Z axes; and (iii) a third (YZ) magnetic sensor group 240C that monitors the position or movement of the stage 14 along the Y and Z axes. With this design, the signals from these magnetic sensor groups 240A, 240B, 240C can be used to monitor the position or movement of the stage 214 along and about the X, Y and Z axes.

It should be noted that in FIG. 2A, at the current position of the stage 214 relative to the base 212, (i) the first magnetic sensor group 240A is positioned directly (not limited to directly) under the first Y magnet array 230C (YZ1), (ii) the third magnetic sensor group 240C is positioned directly under the second Y magnet array 230D (YZ3), and (iii) the second magnetic sensor group 240B is positioned directly under the second X magnet array 230B (XZ4). Further, there is no sensor under the first X magnet array 230A (XZ2). With this design, the three magnetic sensor groups are mounted to the base 214 measuring YZ or XZ positions of YZ1, YZ3, and XZ4 motor quadrants.

It should also be noted that the measurement range of this particular magnetic sensor system 226 is relatively small. However, the range can be improved by adding additional sensor groups along the base 212. A typical stage assembly will include numerous such sensor groups.

Figure 2B:
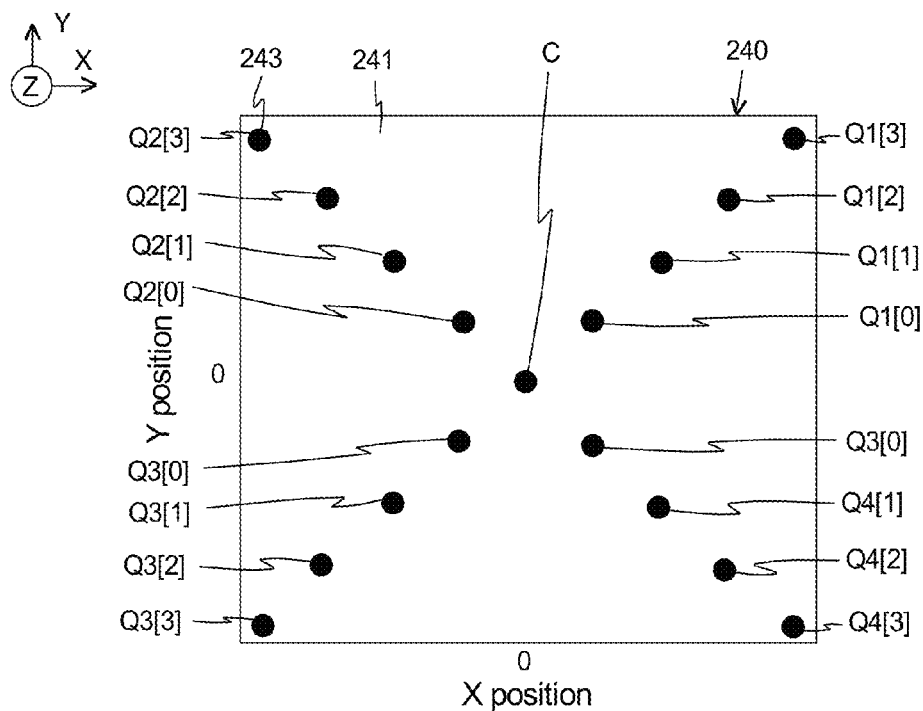
FIG. 2B is view of a sensor group having features of the present invention.

FIG. 2B is top view of one of the sensor groups 240. In this non-exclusive embodiment, the sensor group 240 includes a board 241 with seventeen, individual magnetic sensors 243 that are secured to the board 241. In this embodiment, the hall sensors 243 are spaced ninety degrees apart in both the X and Y axes. Further, the ninety degrees is in relation to motor commutation, and will depend on the design of the magnet array (360 degrees is the space between two north magnets). With this design, the sensor output from each hall sensor 243 is a sinusoidal function of Y (or X) position. In the embodiment described above, the magnetic sensors (e.g. hall sensors) are measuring the magnetic field in the Z direction. However the magnetic sensors can also be positioned in such a way as to measure the X or Y or any other components of the magnetic fields instead.

In FIG. 2B, the seventeen magnetic sensors 243 can be labeled as a center sensor C; a Q1[0] sensor; a Q1[1] sensor; a Q1[2] sensor; a Q1[3] sensor; a Q2[0] sensor; a Q2[1] sensor; a Q2[2] sensor; a Q2[3] sensor; a Q3[0] sensor; a Q3[1] sensor; a Q3[2] sensor; a Q3[3] sensor; a Q4[0] sensor; a Q4[1] sensor; a Q4[2] sensor; and a Q4[3] sensor. In this embodiment, (i) the center sensor C is located at the center of the board 241, (ii) the four Q1 sensors are spaced apart along an axis that is at an angle of 45 degrees; (iii) the four Q2 sensors are spaced apart along an axis that is at an angle of 135 degrees; (iv) the four Q3 sensors are spaced apart along an axis that is at an angle of 225 degrees; and (v) the four Q4 sensors are spaced apart along an axis that is at an angle of 315 degrees. Further, each of these magnetic sensors generates a separate sensor signal.

Figure 2C:
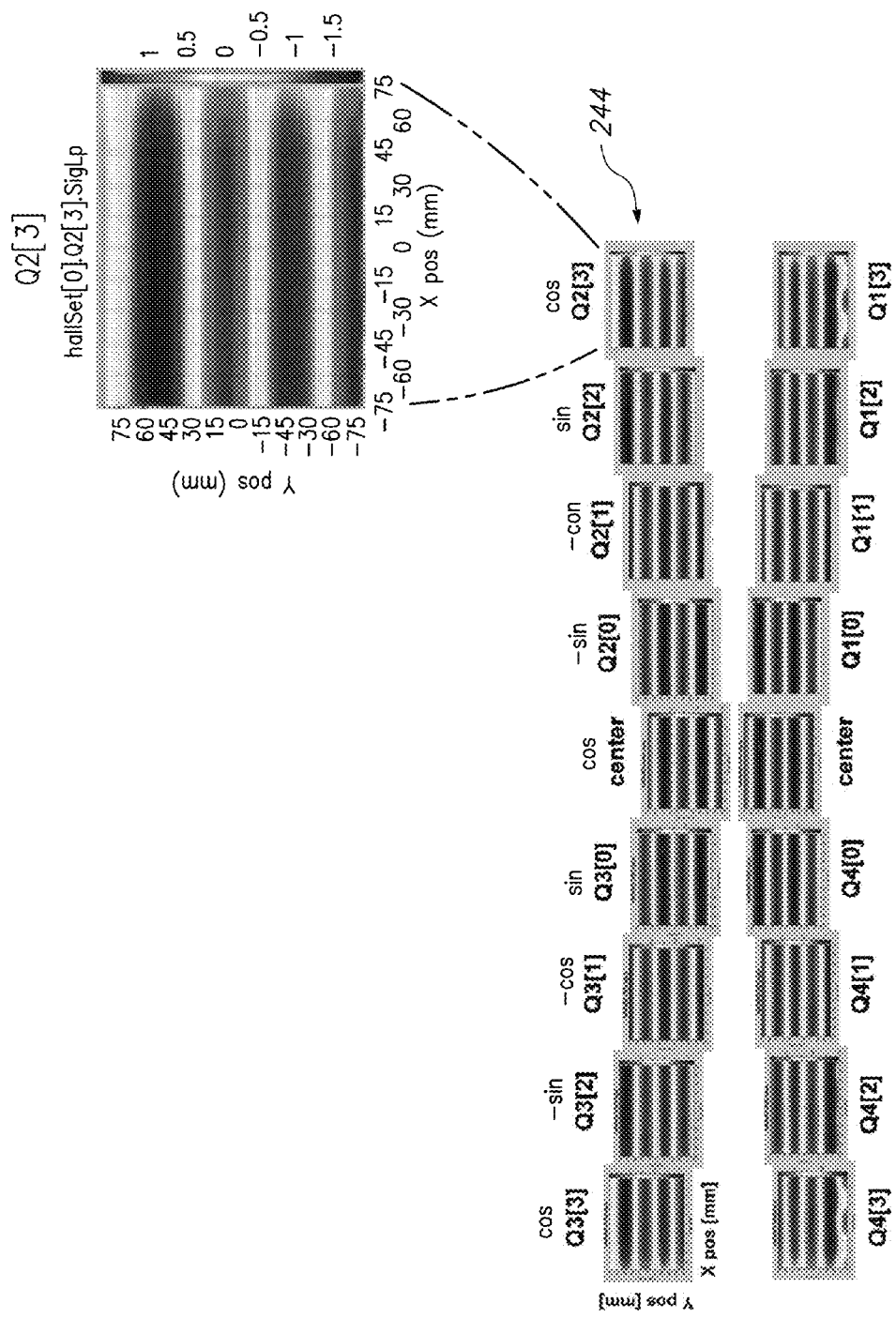
FIG. 2C is a simplified illustration of the sensor group and graphs of the corrected output signal for each sensor.

FIG. 2C is a simplified illustration of the signals from the first (YZ) sensor group 240A from FIG. 2A that is used to monitor position or movement of the stage along the Y axis and Z axis. More specifically, FIG. 2C includes a plurality of graphs, with each graph representing the corrected output signal 244 (with coil flux removed and other corrections) for each of the center sensor C; Q1 [0] sensor; Q1[1] sensor; Q1[2] sensor; Q1[3] sensor; Q2[0] sensor; Q2[1] sensor; Q2[2] sensor; Q2[3] sensor; Q3[0] sensor; Q3[1] sensor; Q3[2] sensor; Q3[3] sensor; Q4[0] sensor; Q4[1] sensor; Q4[2] sensor; and Q4[3] sensor. Stated in another fashion, the corrected output signal 244 for each of the sensors of the sensor group 240A is provided in the graphs of FIG. 2C. An enlarged view of the signal from the Q2[3] sensor is also provided in FIG. 2C.

As provided herein, the control system 20A, 20B (illustrated in FIGS. 1A and 1B) can utilize one or more of the corrected output signals 244 from the sensor group 240A to determine the Y position and the Z position of the stage at this location. It should be noted that the signals from the magnetic sensors 243 are redundant and that as the number of signals utilized is increased, the accuracy is increased. In this example, the redundant magnetic sensors 243 can be synthesized to determine the sine and cosine waves. Further, their phase to calculate the Y (or X) positions, and the amplitude can be used to calculate the Z position.

In this example, at this time with respect to the Y magnet array (not shown) of the stage mover assembly (not shown), moving left to right, (i) sensors Q3[3] and Q4[3] generate a corrected output signal 244 having a cosine voltage; (ii) sensors Q3[2] and Q4[2] generate a corrected output signal 244 having a minus sine voltage; (iii) sensors Q3[1] and Q4[1] generate a corrected output signal 244 having a negative cosine voltage; (iv) sensors Q3[0] and Q4[0] generate a corrected output signal 244 having a sine voltage; (v) the center sensor generates a corrected output signal 244 having a cosine voltage; (vi) sensors Q2[0] and Q1[0] generate a corrected output signal 244 having a minus sine voltage; (vii) sensors Q2[1] and Q1[1] generate a corrected output signal 244 having a minus cosine voltage; (viii) sensors Q2[2] and Q1[2] generate a corrected output signal 244 having a sine voltage; and (ix) sensors Q2[3] and Q1[3] generate a corrected output signal 244 having a cosine voltage.

As provided herein, in one non-exclusive embodiment, using the corrected output signals 244 from the first (YZ) sensor group 240A, the Y position and the Z position of the stage can be calculated as follows:

$$y = \frac{L_{magnet}}{2\pi} \tan^{-1}\left(\frac{V_{sin}}{V_{cos}}\right) \quad \text{Equation 1}$$

$$Z = k_z \cdot \sqrt{V_{sin}^2 + V_{cos}^2} \quad \text{Equation 2}$$

In these equations, (i) y is the y position along the Y axis, (ii) Z is the z position along the Z axis, (iii) $L_{magnet}$ is the magnetic pitch of the magnet array (separation distance between two nearest North magnets), (iv) V cos is the cosine voltage determined using the corrected output signal 244 from one or more of the magnetic sensors 243 of the first (YZ) sensor group 240A, (v) V sin is the sine voltage determined using the corrected output signal 244 from one or more of the magnetic sensors 243 of the first (YZ) sensor group 240A, and (vii) kz is a calibrated term calibrated for each sensor group as described below in reference to Equation 2. Each sensor has a somewhat similar kz value and it can be more convenient to calibrate the kz value using a group of sensor signals. In this example, the phase of the output signal(s) 244 is used to calculate the Y position, while the amplitude of the output signal(s) 244 is used to determine the Z position.

It should be noted that number of output signals 244 used to determine V cos and V sin can vary. Generally speaking, the accuracy increases as the number of output signals 244 are increased.

For example, two signals can be used in Equations 3 and 4 to determine V cos and V sin:

$$V_{cos} = V_{center} \qquad \text{Equation 3}$$

$$V_{sin} = V_{Q1[0]} \qquad \text{Equation 4}$$

In this non-exclusive example, the corrected output signal ($V_{center}$) from the center sensor C can be used to determine V cos, and the corrected output signal ($V_{Q1[0]}$) from the Q1[0] sensor can be used to determine V sin.

As another non-exclusive example, five output signals 244 can be can be used in Equations 5 and 6 to determine V cos and V sin:

$$V_{cos} = \frac{2V_{center} - V_{Q1[1]} - V_{Q2[1]}}{4} \qquad \text{Equation 5}$$

$$V_{sin} = \frac{2V_{Q1[0]} - 2V_{Q2[0]}}{4} \qquad \text{Equation 6}$$

In this non-exclusive example, (i) the corrected output signal ($V_{center}$) from the center sensor C, the corrected output signal ($V_{Q1[1]}$) of the Q1[1] sensor, and the corrected output signal ($V_{Q2[1]}$) the Q2[1] sensor can be used to determine V cos, and (ii) the corrected output signal ($V_{Q1[0]}$) from the Q1[0] sensor, and corrected output signal ($V_{Q2[0]}$) from the Q2[0] sensor can be used to determine V sin.

Still alternatively, seven output signals 244 can be can be used in Equations 7 and 8 to determine V cos and V sin:

$$V_{cos} = \frac{4V_{center} - 2V_{Q1[1]} - 2V_{Q2[1]}}{8} \qquad \text{Equation 7}$$

$$V_{sin} = \frac{V_{Q2[2]} - 3V_{Q2[0]} + 3V_{Q1[0]} - V_{Q1[2]}}{8} \qquad \text{Equation 8}$$

In this non-exclusive example, (i) the corrected output signal ($V_{center}$) from the center sensor C, the corrected output signal ($V_{Q1[1]}$) of the Q1[1] sensor, and the corrected output signal ($V_{Q2[1]}$) the Q2[1] sensor can be used to determine V cos, and (ii) the corrected output signal ($V_{Q2[2]}$) from the Q2[2] sensor, corrected output signal ($V_{Q2[0]}$) from the Q2[0] sensor, the corrected output signal ($V_{Q1[0]}$) from the Q1[0] sensor, and corrected output signal ($V_{Q1[2]}$) from the Q1[2] sensor can be used to determine V sin.

In many instances, the sensor signals 244 near the edge of the respective magnet array are not used because of the magnet edge effect. For example, in FIG. 2C, the sensor signals 244 from sensors Q1[3], Q2[3], Q3[3], and Q4[3] are not used because at this position, they are near the edges of the first Y magnet array 230C (YZ1) (illustrated in FIG. 2A).

However, as the stage is moved relative to the base, the sensors 243 that will be at the edges will change and the center sensor will change.

It should be noted that the X position and the Z position can be calculated using the signals from the XZ sensor group 240B (illustrated in FIG. 2A) in a similar fashion. For XZ quadrants:

$$x = \frac{L_{magnet}}{2\pi} \tan^{-1}\left(\frac{V_{sin}}{V_{cos}}\right) \text{ and } Z = k_z \cdot \sqrt{V_{sin}^2 + V_{cos}^2}.$$

Figure 2D:
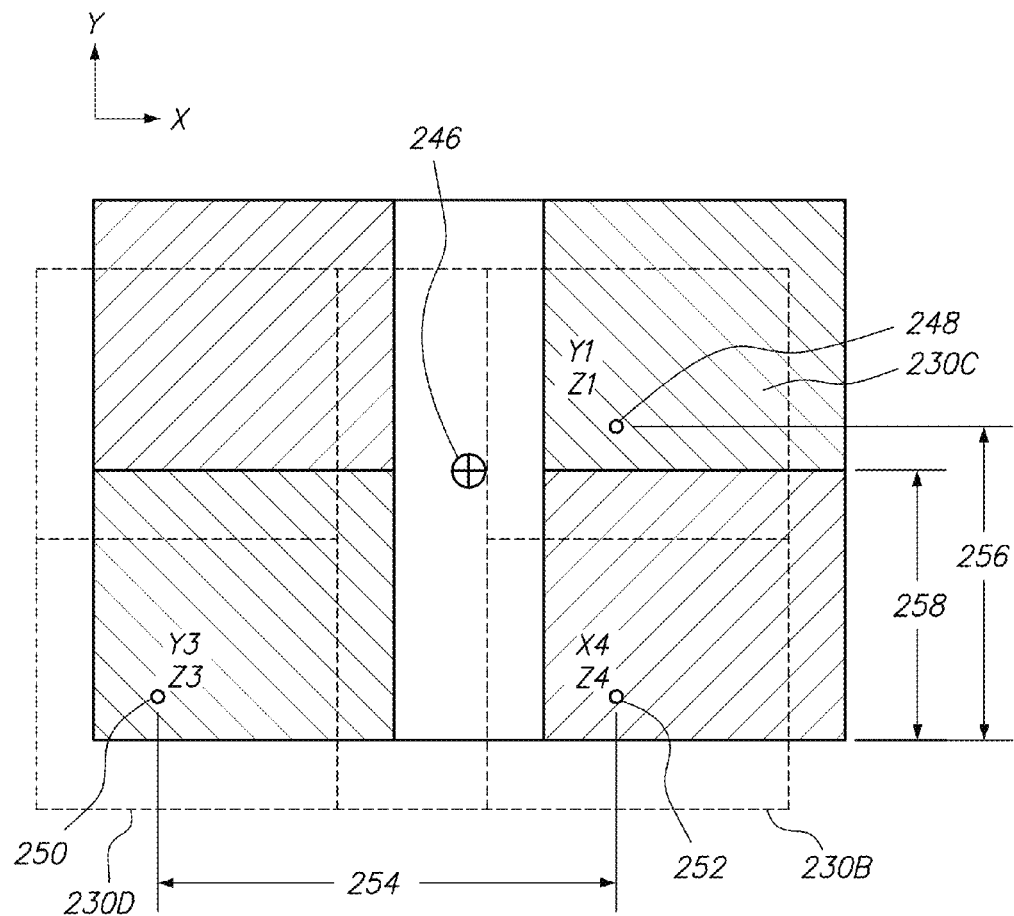
FIG. 2D illustrates a portion of a stage and formula used to transform a coordinate system.

Referring to FIG. 2D, in certain embodiments, it is desired to transform the measurements from the various sensor groups 240 to the center of gravity of the stage coordinate positions along and about the X, Y, and Z axes. A simplified example, of how coordinate transformation from the quadrant positions Y1, Y3, X4, Z1, Z3, and Z4 to the stage center of gravity (CG) 246 positions (x, y, z, $\theta_x$, $\theta_y$, $\theta_z$) can be calculated is provided in reference to FIG. 2D. In FIG. 2D, (i) reference number 246 indicates the center of gravity of the stage, (ii) reference number 248 represents the Y1, Z1 position (center of the first Y magnet array 230C (YZ1)), (iii) reference number 250 represents the Y3, Z3 position (center of the second Y magnet array 230D (YZ3)), (iv) reference number 252 represents the X4, Z4 position (center of the second X magnet array 230B (XZ4)), (v) reference number 254 represents the distance ($L_{Z3Z4}$) between Z3 and Z4 along the X axis, (vi) reference number 256 represents the distance ($L_{Z1Z4}$) between Z1 and Z4 along the Y axis, and (vii) reference number 258 represents the distance ($B_4$) between center of gravity 246 of the stage and X4, Z4 along the Y axis. It should be noted that the distance ($L_{Y1Y3}$) between Y1 and Y3 along the X axis is equal to $L_{Z1Z4}$.

In certain embodiments, the following equations can be used for the coordinate transformation:

$$\theta_x = \frac{Z1 - Z4}{L_{Z1Z4}} \qquad \text{Equation 9}$$

$$\theta_y = \frac{Z3 - Z4}{L_{Z1Z4}} \qquad \text{Equation 10}$$

$$\theta_z = \frac{Y1 - Y3}{L_{Y1Y3}} \qquad \text{Equation 11}$$

$$x = X4 - (y - b_{x4}) * \theta_z \qquad \text{Equation 12}$$

$$y = \frac{Y1 + Y3}{2} + x * \theta_z \qquad \text{Equation 13}$$

$$z = \frac{Z1 + Z3}{2} + y * \theta_x - x * \theta_y \qquad \text{Equation 14}$$

As provided herein, in order to improve the accuracy of the magnetic sensor system 26, the magnetic sensors of sensor groups can be calibrated. A number of non-exclusive ways to calibrate the magnetic sensors are provided herein. For example, in certain embodiments, the calibration of the magnetic sensor system 26 includes one or more of the following calibrations: (i) sensor decoupling from the coil flux of the conductor assembly; (ii) sensor offset removal and gain equalization; (iii) Quadrant Z gain calibrations; and/or (iv) correction maps for XZ and YZ quadrant positions. These calibrations are described in more detail below.

First, in certain embodiments, the present invention decouples the coil flux from the coils 34, 36 (illustrated in FIG. 10) of the conductor assembly 32 (illustrated in FIG. 10) from the measurements taken by the magnetic sensor system 26A, 26B (illustrated in FIGS. 1A and 1B). As provided herein, each of the magnetic sensors measures the flux generated by the nearby magnets and the coil flux that results from current in the nearby coils 34, 36 used to position the stage. The measured flux from the magnets can be used to determine the position, while the flux from the coils 34, 36 can interfere with the measured flux. Thus, in certain embodiments, the present invention decouples the coil flux from the coils 34, 36 of the conductor assembly 32 from the measurements taken by the magnetic sensor system 26.

In certain embodiments, for a moving magnet, six degree of freedom mover, the decoupling from the coil flux can be achieved by sequentially, and individually activating (directing current to) the individuals coils 34, 36 (illustrated in FIG. 1C), and measuring the influence on each sensor in the magnetic sensor system 26A, 26B. In one embodiment, this can be performed with the stage not being levitated (stage sitting on conductor array) by the stage mover. At this time, the control system sequentially directs a test current (through each individual coil 34, 36). The test current is small enough not to move the stage. With this design, the influence of coil flux from the activation of each individual coil 34, 36 on each individual sensor in the magnetic sensor system 26A, 26B can be measured. As provided herein, coil flux is linearly proportional to the current. Because the stage is not moving (not levitated), the magnetic fields do not change. Only the coil flux is changing.

Figure 3A:
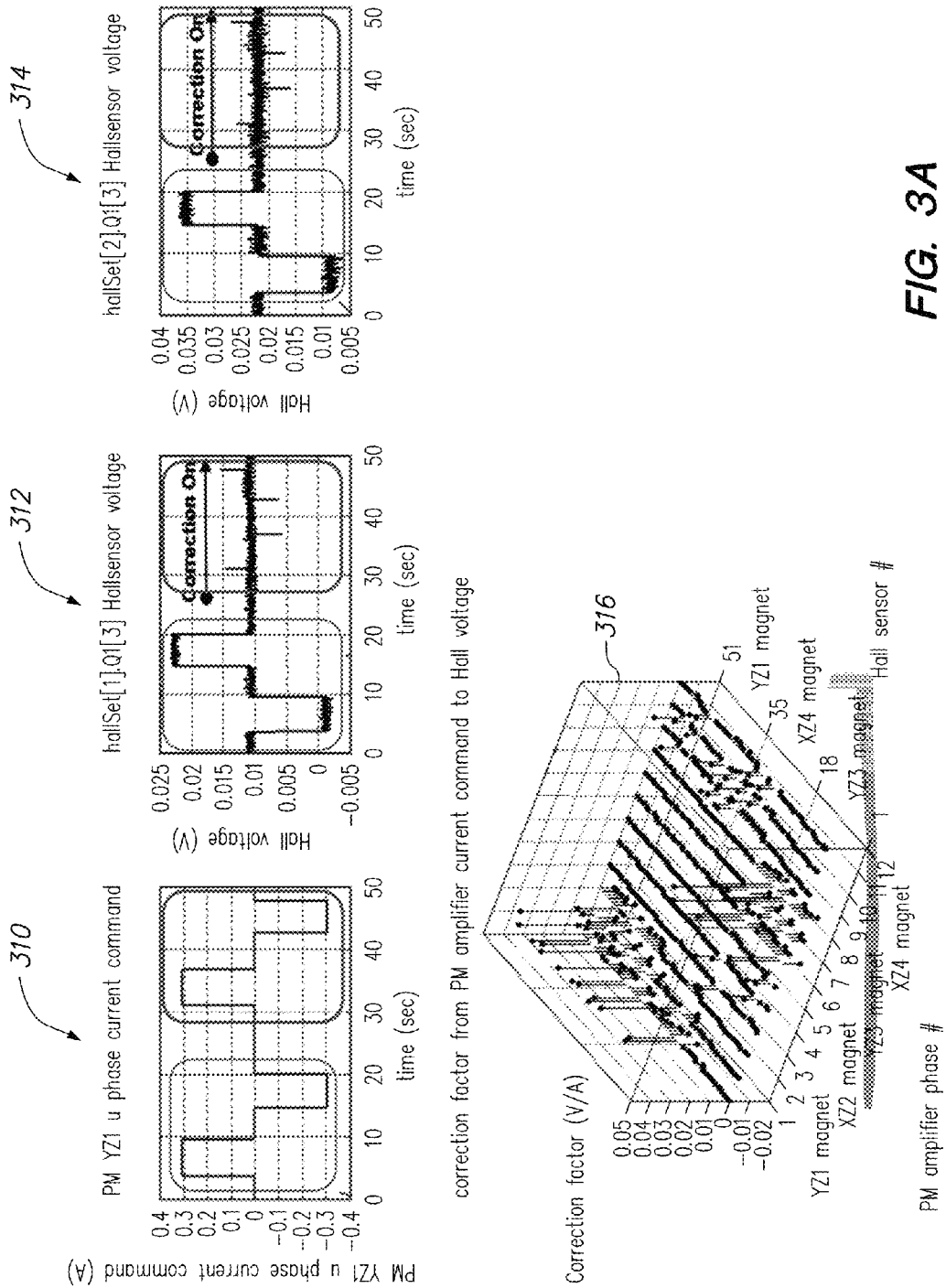
FIG. 3A includes a graph that illustrates a current command, a graph that illustrates the resulting magnetic sensor voltage, and a non-exclusive example of a calibration matrix.

FIG. 3A includes (i) a graph 310 that illustrates a current command sequentially directed to the coils 34, 36, (ii) a graph 312 that illustrates the resulting magnetic sensor output (voltage) for one of the magnetic sensors (sensor Q1[3]) when current is directed to one of the coils 34, 36, and (iii) a graph 314 that illustrates the resulting magnetic sensor output (voltage) on the magnetic sensor (sensor Q1[3]) when current is directed to another one of the coils 34, 36. With the information from each magnetic sensor after the sequential activation of the coils 34, 36, a calibration matrix 316 can be generated. FIG. 3A also includes one example of the calibration matrix 316 that provides a correlation between the current flux in each coil to the sensor output for each magnetic sensor. The current flux correction matrix is equal to the ratio of individual magnetic sensor voltage divided by the individual coil current command.

Because the coil flux is linearly proportional to current, and the amount of current to each coil at a particular time is known, this calibration matrix can be used to decouple the coil flux from the measurements taken by the magnetic sensors. Generally, the sensors that are closer to the activated coil will have a higher coil flux reading than the sensors that are farther away from the activated coil. As provided herein, the sensor corrected output vector is equal to the sensor output vector plus the correction matrix multiplied by the coil current command vector.

It should be noted that other ways are possible to decouple the coil flux from the magnetic sensor measurements.

Figure 3B:
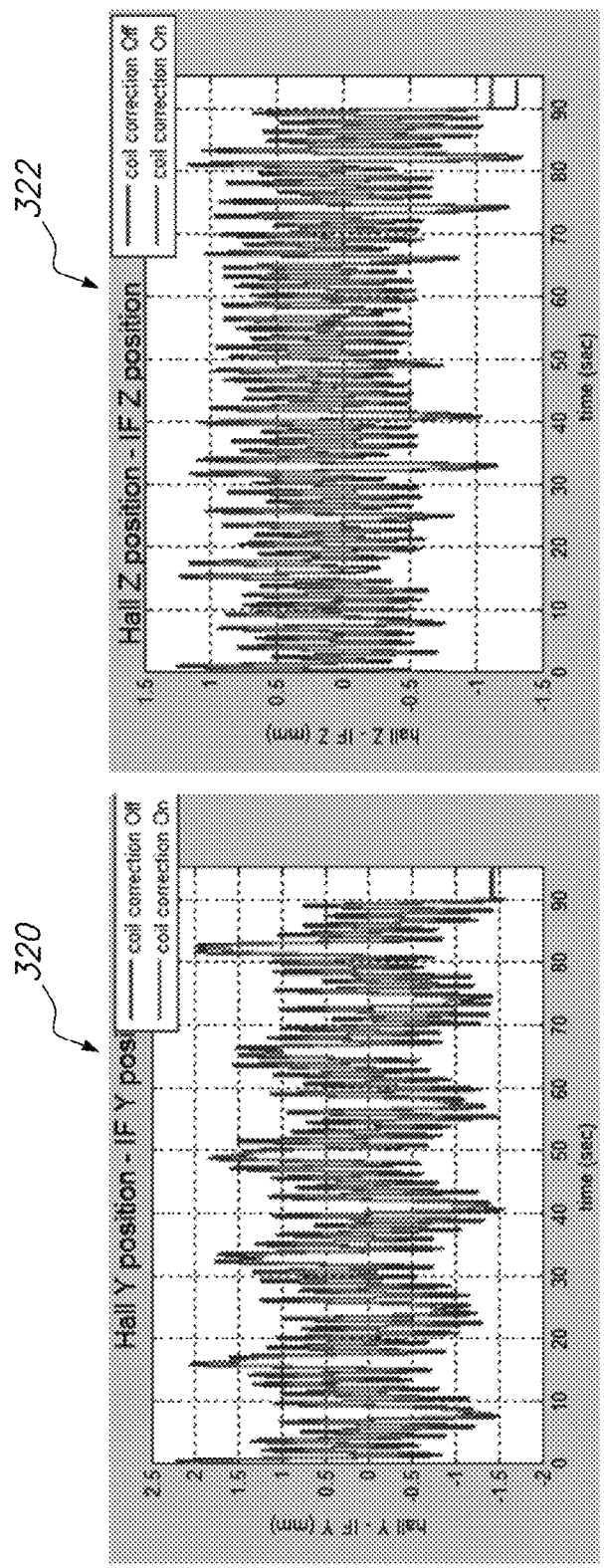
FIG. 3B includes a couple of graphs that illustrate the position error.

FIG. 3B includes (i) a first graph 320 that illustrates the position error (as measured with the second sensor system) of the magnetic sensor system along the Y axis with the coil flux decoupling on and off; and (ii) a second graph 322 that illustrates the position error (as measured with the second sensor system) of the magnetic sensor system along the Z axis with the coil flux decoupling on and off. These graphs illustrate that the coil flux decoupling improves the accuracy of the magnetic sensor system. The magnetic sensor system still has errors in positioning, but the errors are reduced with the coil flux decoupling. During these tests, the control system controls the position of the stage using the magnetic sensor system, while measuring the position error using the second sensor system.

Typically, because coil flux is linearly proportional to current, the coil flux will be large during stage accelerations and decelerations because the current will be large. Thus, it can be important to preform coil flux decoupling.

Figure 4:
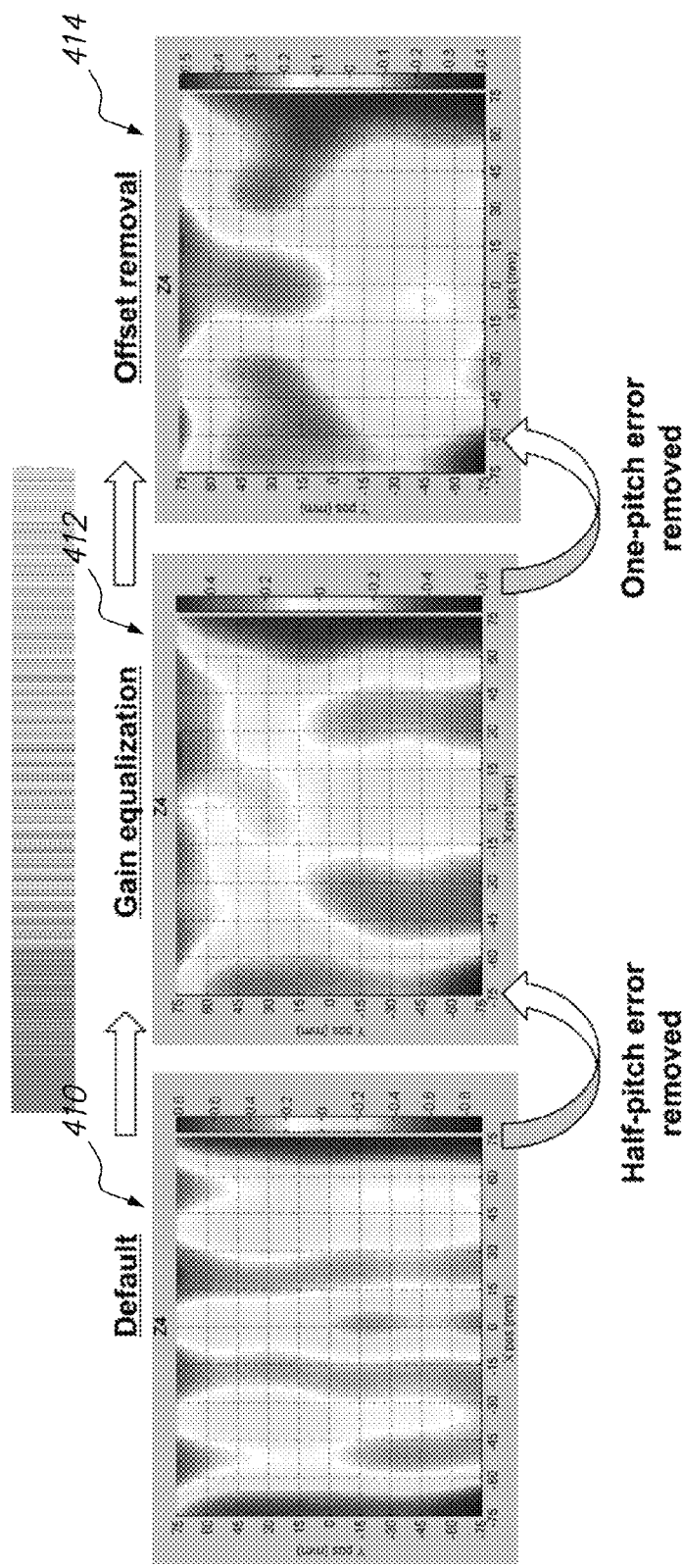
FIG. 4 includes a first graph that is the default, a second graph of gain equalization, and a third graph with offset removal.

As provided herein, each magnetic sensor has a different gain and a different offset. As provided above, the second calibration step is gain equalization and sensor offset removal. To achieve gain equalization, all of the magnetic sensors need to output sinusoidal signals of the same amplitude when the stage travels in the X and Y directions at the same flight height (same Z height of the stage). Further, the sinusoidal signals form the magnetic sensors need to have zero DC offset. FIG. 4 includes three graphs, including a first graph 410 that is the default, a second graph 412 of gain equalization, and a third graph 414 with offset removal.

In one embodiment, without the magnet assembly positioned near the magnetic sensor assembly and without the activation of any coils, the output signal of each magnetic sensor is measured. The measured output signal can be used as the offset. However, in certain embodiments, this value is not accurate enough.

One way to better calculate this correction is to drive the stage using the second sensor system (e.g. the interferometer) while monitoring the Z position with the magnetic sensors. In one embodiment, the difference between the magnetic sensors (after coil flux correction) and the second sensor system can be measured along the Z axis. The default graph 410 of FIG. 4 plots the default position, which is the difference between the Z position measurements of magnetic sensors (after coil flux correction) and the second sensor system.

Referring back to FIG. 2C, each magnetic sensor has an output signal that can be illustrated in an output graph, and there is an average value for each graph. The average value of the graph for a particular magnetic sensor is the offset number for that magnetic sensor. Thus, the average value for each magnetic sensor can be used as its offset number. Subsequently, each magnetic sensor reading will be changed by this offset number.

Each Figure includes two magnet arrays in X and Y position. Because there are four cycles, the offset can be calculated. The amplitude of the sine and cosine can be checked and normalized. Each sensor will have a different amplitude, and the average value can be subtracted from the different amplitude and divided by the amplitude to normalize the output signal (so that the output signal will be minus one to one for all of the sensors). This will correct the gain error of the sensors. This step is performed for each sensor.

Next, as provided above, the third calibration step is Z gain calibration for each quadrant. As provided herein, the amplitude of the sinusoidal output signals from the magnetic sensors can be used to determine the Z position information. For example, (i) the amplitude of the sinusoidal output signals increases as the Z position of the magnet assembly (and stage) decreases (becomes closer), and (ii) the amplitude of the sinusoidal output signals decreases as the Z position of the magnet assembly (and stage) increases (goes farther away).

In one embodiment, the Z gain calibration can be performed by controlling the stage to move along the Z axis (the control system controlling the stage mover assembly to change the Z heights using measurements from the magnetic sensor system or the second sensor system, e.g. an interferometer) while comparing the Z measurements of the second sensor system to the magnetic sensor system. For example, during initialization, the stage can be controlled to fly up to one to two millimeters from the base while controlling the stage mover assembly using magnetic sensor servo.

In certain embodiments, the zero position of the magnetic sensor is not well defined. In one embodiment, the upper surface of the base is used as the zero position of the magnetic sensor.

As provided herein, the Z direction voltage (Vz) can be calculated as follows, where $$V_Z = \sqrt{V_{sin}^2 + V_{cos}^2}$$

Equation 14

The values for V sin and V cos can be determined as provided above in Equations 3-8 with the magnetic sensors for each Z position.

Further, the amplitude of the output signal of each magnetic sensor changes with the stage Z position so that:

$$k_z = \frac{\Delta Z_{IF}}{\Delta V_z} \Rightarrow Z_{hall} = k_z \cdot V_z$$

Equation 16

Thus, the calibrated term $k_z$ for each sensor group can be determined.

Figure 5A:
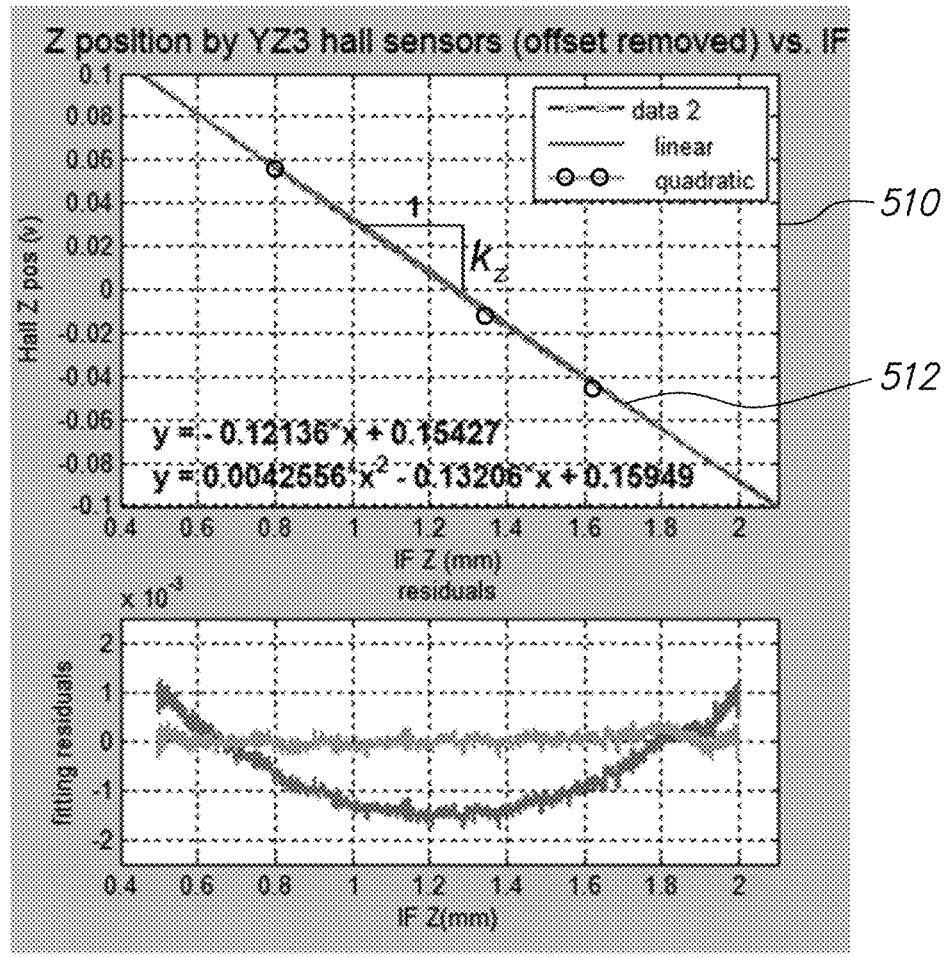
FIGS. 5A, 5B and 5C illustrate alternative graphs and formulas used to calibrate Z gain for each quadrant.

FIG. 5A includes a graph 510 that plots the magnetic sensor Z position versus the interferometer (IF) Z position. As provided herein, calibrated term kz can be equal to the slope of the line 512 (dashed) in FIG. 5A from data acquired. Alternatively, the line can be calculated with linear (solid) or quadratic equations (solid line with circles). The fitting error for the linear and quadratic is also illustrated in FIG. 5A.

With reference Equation 2 above, the calibrated term kz allows for the calculation of the Z position using the V cos and V sin signals determined with the magnetic sensors. Thus, once the calibrated term kz is calculated for each sensor group, the Z position can be determined using the V cos and V sin signals from the magnetic sensors.

Figure 5B:
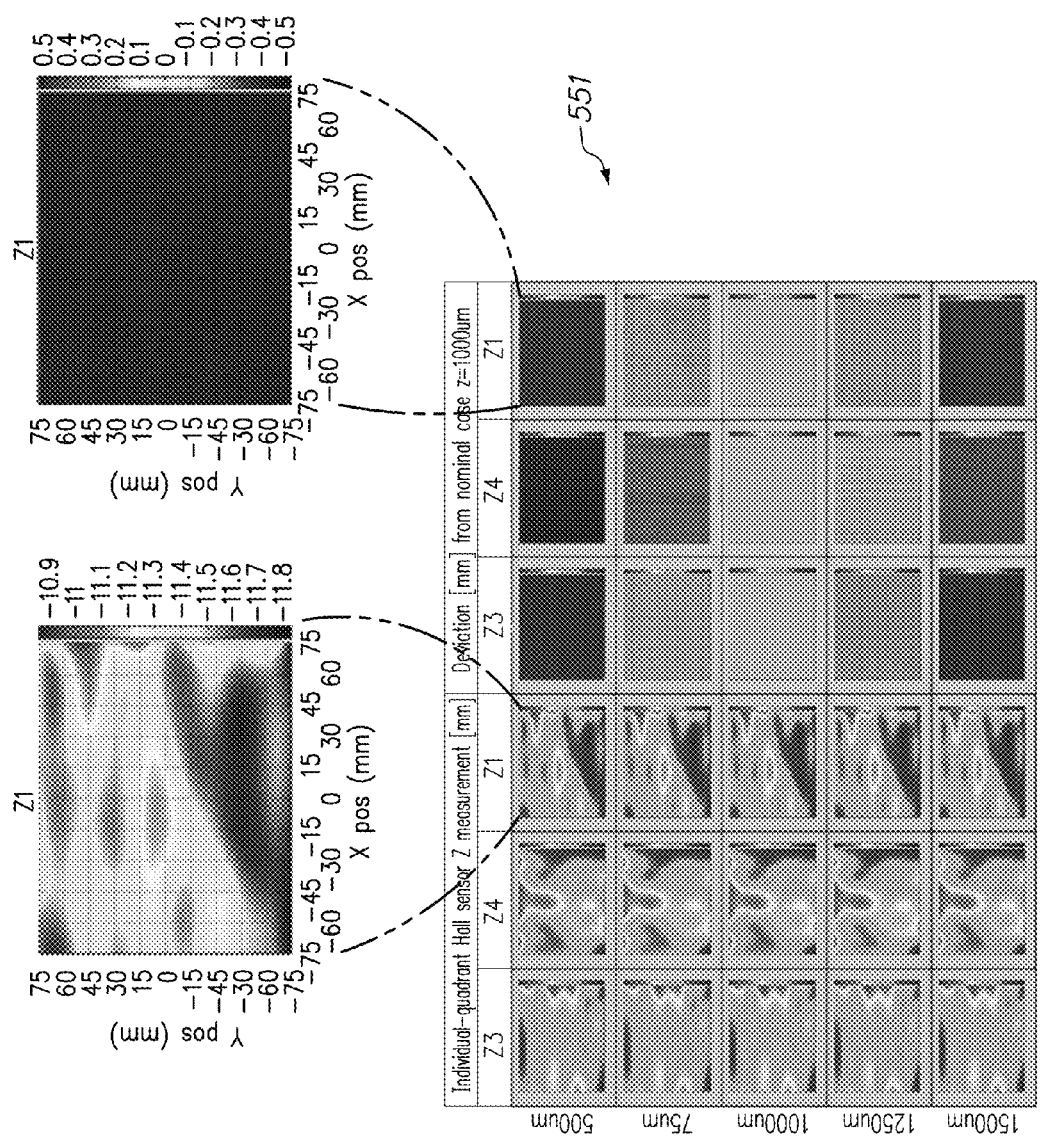

FIG. 5B includes graphs 551 that illustrate the quadrant Z position patterns at various flight heights. A couple of graphs 551 are enlarged. As provided herein, even after the correction done above, there are still residual errors in the Z position measurements taken with the magnetic sensors at various flight heights for the Z1, Z3 and Z4 quadrants. These residual non-linear errors do not change with Z height. As provided herein, these residual errors can be subtracted using a look-up table for the different X-Y positions because these errors are independent of the Z height. In FIG. 5B the graphs on the left are the individual quadrant magnetic sensor Z measurements, and the graphs on the right are the deviations from nominal.

Figure 5C:
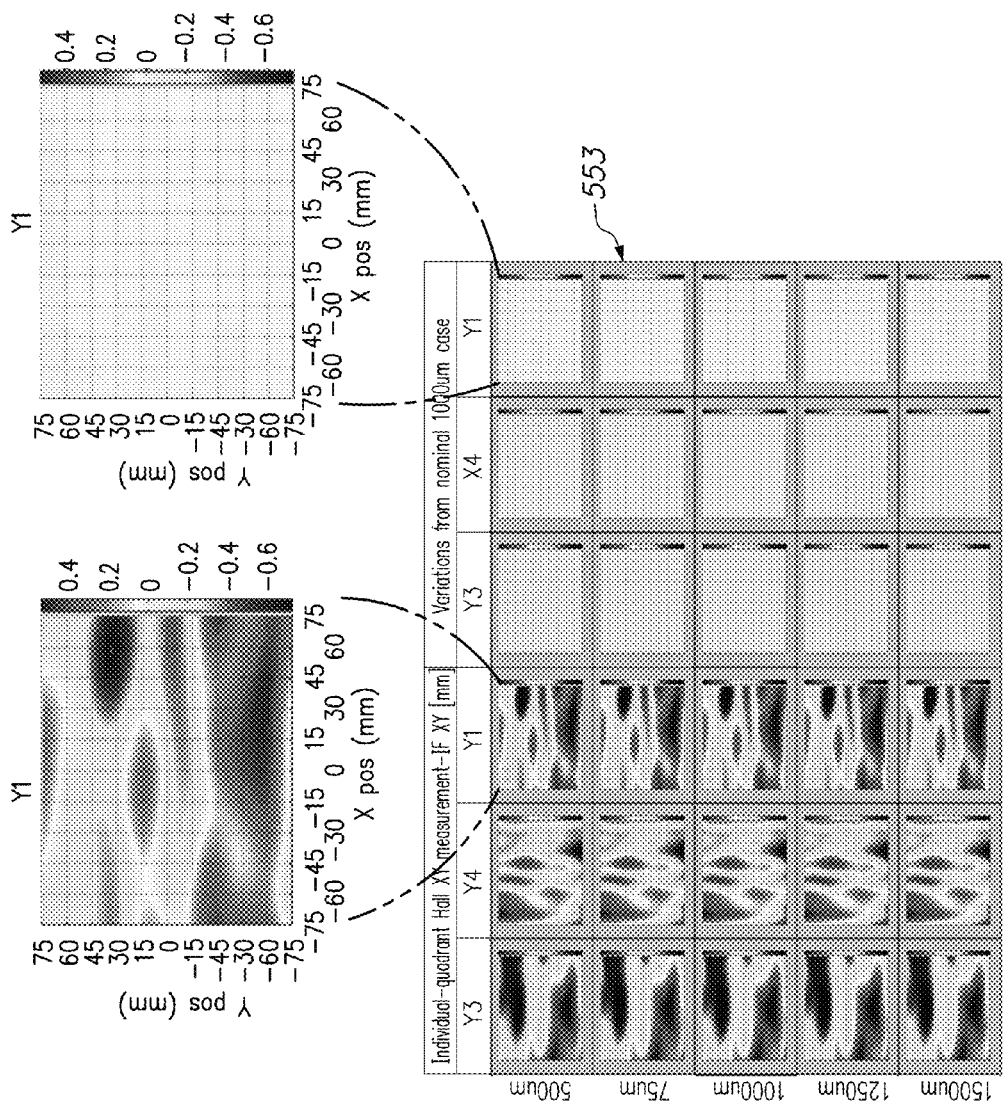

FIG. 5C includes graphs 553 that illustrate the quadrant XY position patterns at various flight heights. A couple of graphs 551 are enlarged. Further, in FIG. 5C the graphs 553 on the left are the individual quadrant magnetic XY measurement minus the interferometer XY measurement, and the graphs on the right are the variations from normal.

Figure 6A:
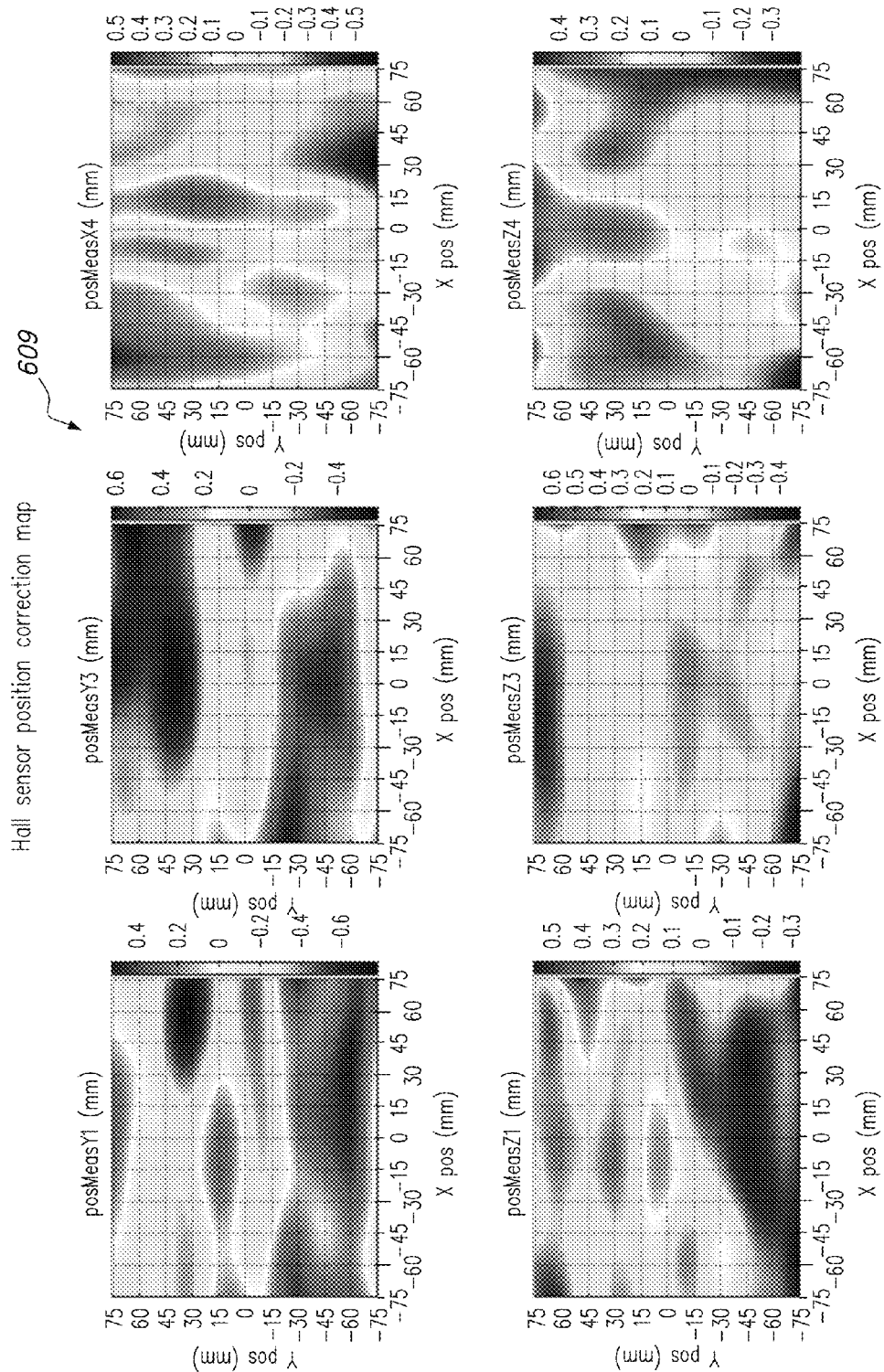

Moreover, as provided above, the fourth calibration step is correction maps for XZ and YZ quadrant positions. In this embodiment, the stage mover assembly can be controlled to move the stage on a slow long scanning motion with both the second sensor system and the magnetic sensor system monitoring the position of the stage with six degrees of freedom. For example, the stage mover assembly can be controlled using the measurement signal from the second sensor system (e.g. the interferometer). Subsequently, the difference between the second sensor position measurements is compared to the magnetic sensor position measurements to determine the magnetic sensor error and to generate a magnetic sensor position correction map. FIG. 6A includes a plurality of graphs 609 of a generated magnetic sensor position correction map that can be used by the control system. Each graph is for each X and Y position, and the output is the correction value for the magnetic sensor.

It should be noted that the X and Y magnetic sensor position is sensitive to stage speed. In certain embodiments, an averaged correction map can be generated from multiple scans performed at different speeds. In certain embodiments, the correction map is not sensitive to stage flight height Z. This correction map can be used to reduce the X-Y position dependent patterns.

Figure 6B:
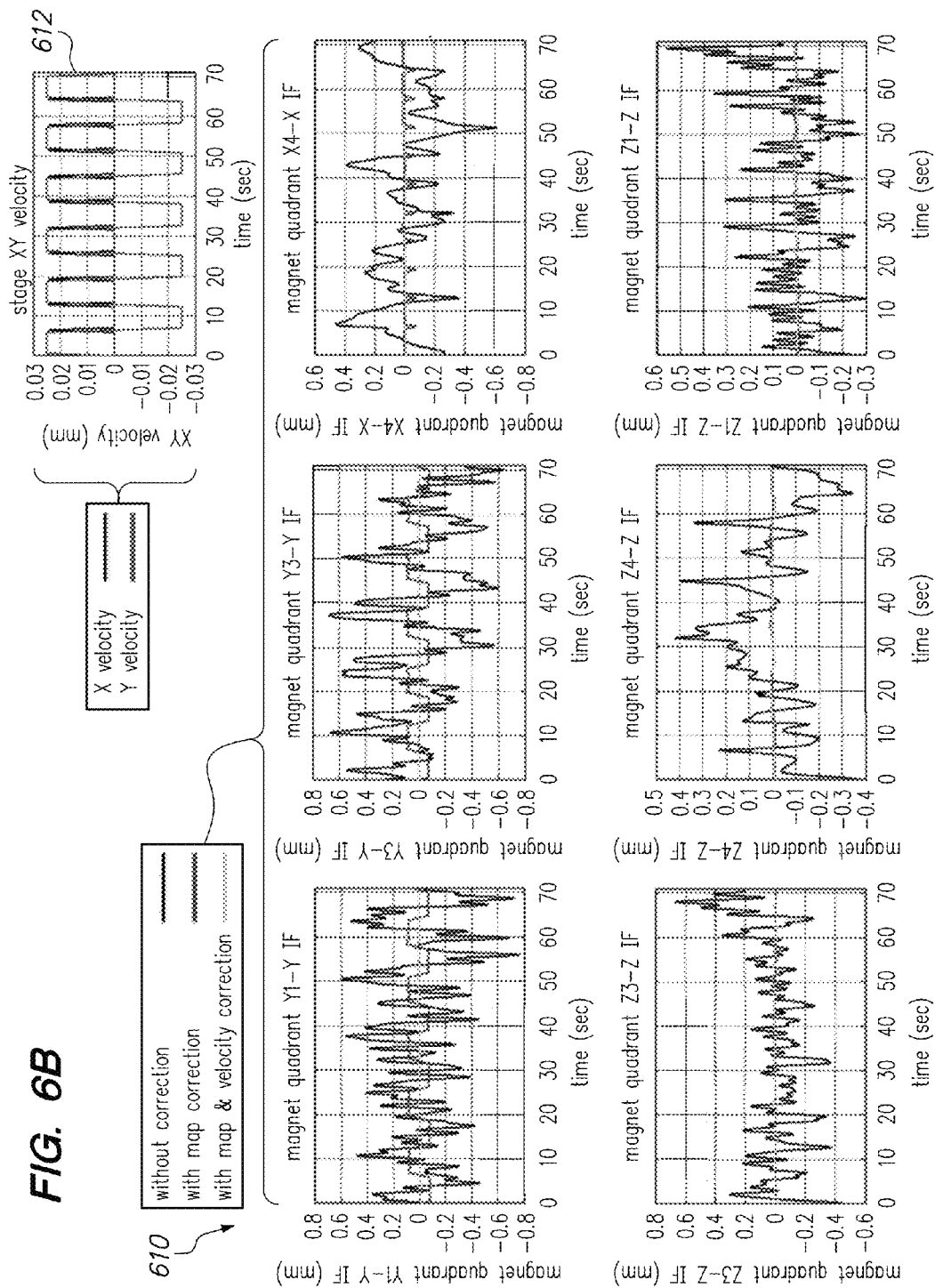

FIG. 6B includes a plurality of graphs 610 that illustrate the quadrant magnetic position measurement errors for a scan performed at a one millimeter flight height and at twenty-five millimeters per second scan speed. The quadrant XY position measurements have stage velocity dependency, corrected with a constant factor. FIG. 6B includes (i) a graph 612 that illustrates stage X and Y velocity versus time (Y velocity has constant speed portion because scanning direction), and (ii) six graphs 610 that illustrate the magnetic sensor errors at alternative magnet quadrants without the correction, with map correction, and with map and velocity correction. These graphs illustrate that the correction map and the velocity correction are quite effective for reducing the magnetic sensor errors. As provided herein, the velocity related errors can be corrected by determining a velocity correction factor using these graphs.

FIG. 6C includes a plurality of graphs that illustrate how well the calibrations work for different stage flight heights. More specifically, FIG. 6C includes (i) a graph 620 that illustrates stage X and Y position versus time, (ii) a graph 622 that illustrates stage XY velocity versus time, and (iii) six graphs 624 that illustrate the magnetic sensor errors at alternative magnet quadrants at three alternative fly heights (e.g. at 750, 1000, and 1250 micron flight heights) with a twenty-five millimeters per second scan speed. These graphs illustrate that the calibrations are good for the different flight heights.

Figure 6D:
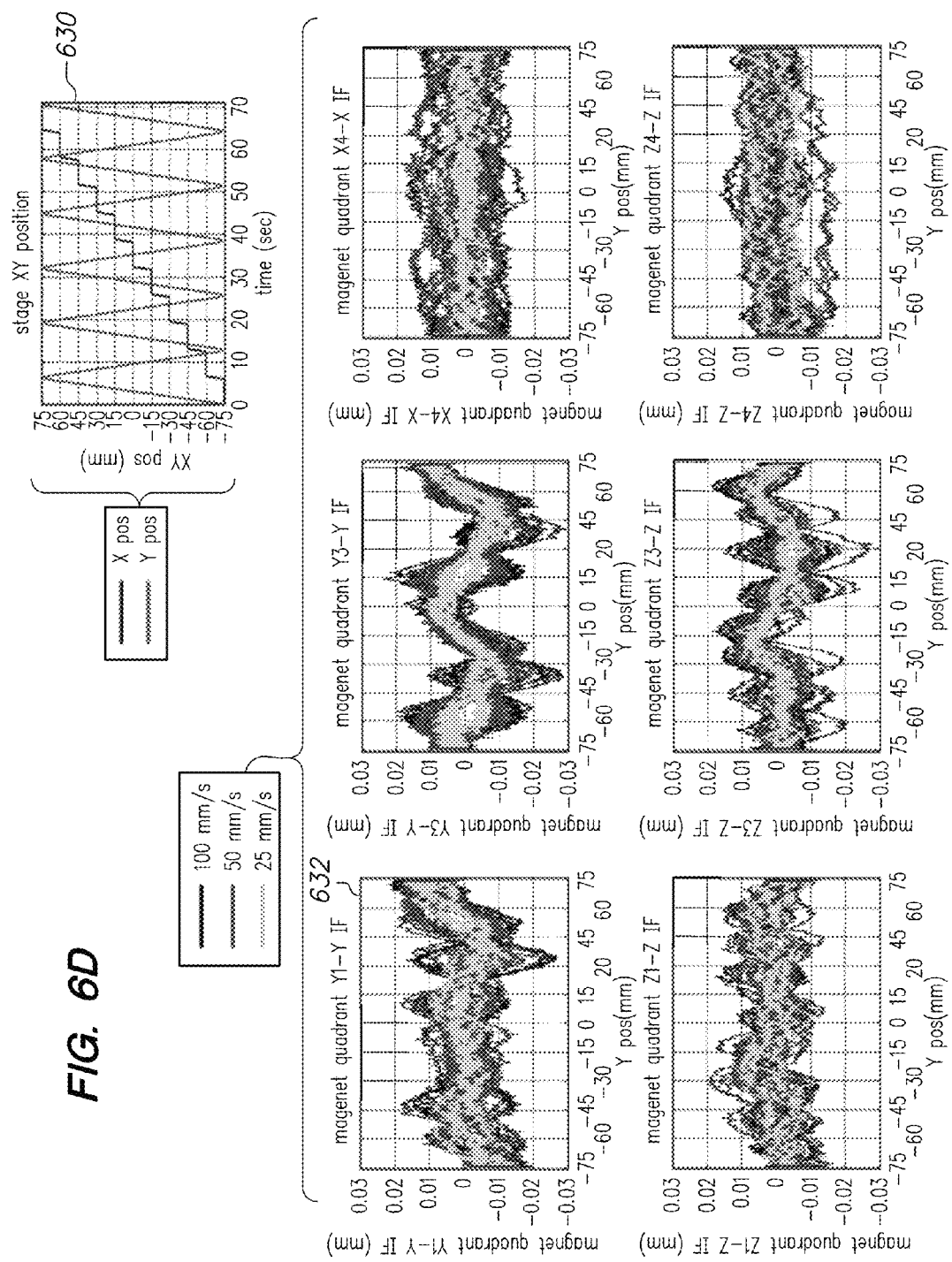

FIG. 6D includes a plurality of graphs that illustrate how well the calibrations work for different Y axis scan speeds. FIG. 6D includes (i) a graph 630 that illustrates stage X and Y position versus time, and (ii) six graphs 632 that illustrate the magnetic sensor errors at alternative magnet quadrants at three alternative Y axis scan speeds (e.g. at 25, 50, and 100 millimeters per second) with a one millimeter flight height. These graphs illustrate that the calibrations are good for different Y axis scan speeds.

Figure 7A:
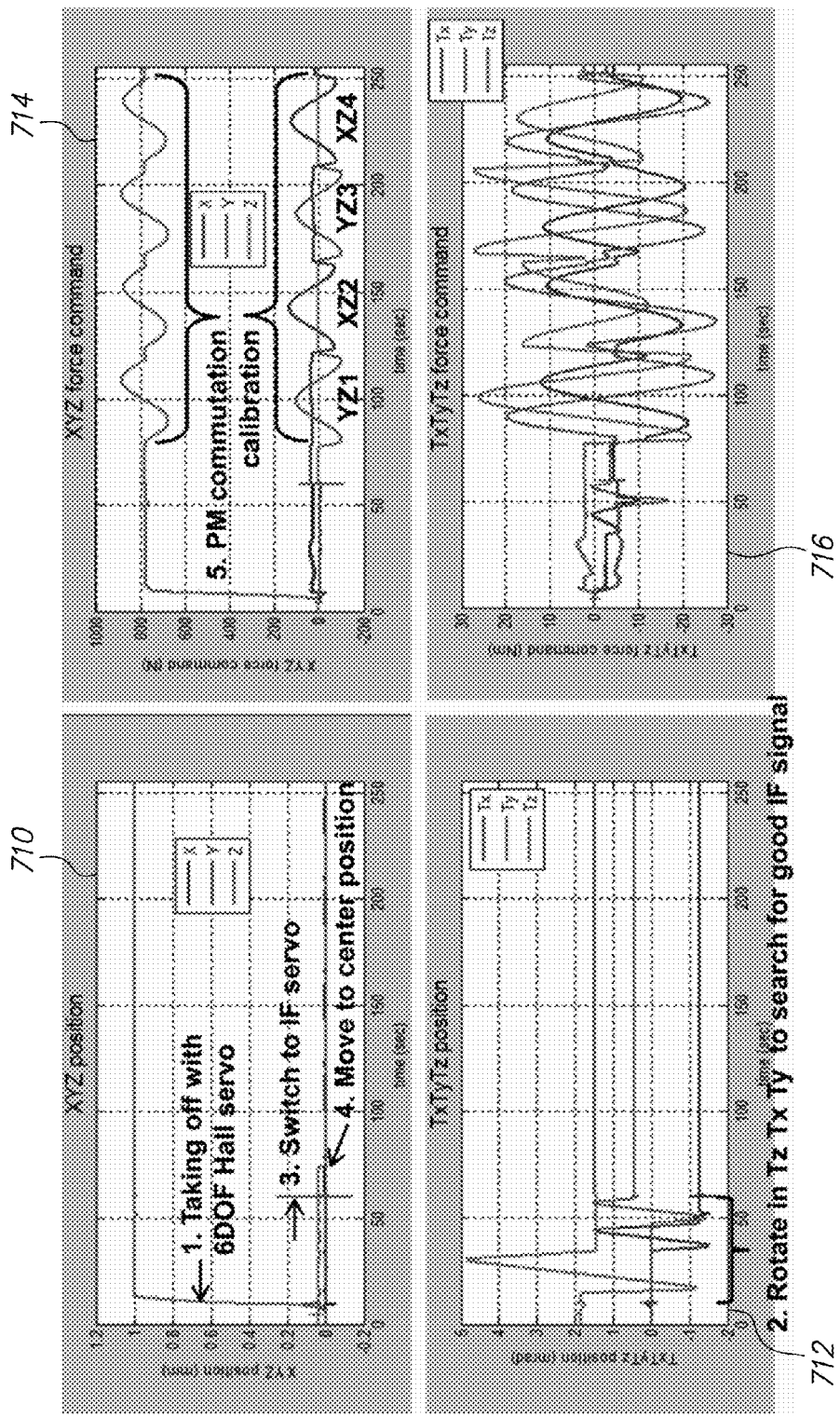
FIG. 7A includes a number of graphs that illustrate the initialization of the magnetic sensor assembly.

After the magnetic sensor system is calibrated, the magnetic sensor system can be used in the initialization of the stage if the second sensor system is not available. FIG. 7A includes a number of graphs that are useful for the discussion of the initialization of the stage using magnetic sensor system. More specifically, FIG. 7A includes (i) graph 710 that illustrates X,Y, and Z position versus time, (ii) graph 712 that illustrates Tx (theta X), Ty (theta Y), and Tz (theta Z) position versus time, (iii) graph 714 that illustrates XYZ force commands versus time, and (iv) graph 716 that illustrates Tx (theta X), Ty (theta Y), and Tz (theta Z) force commands versus time.

In one non-exclusive embodiment, the stage can initially be controlled in all six degrees of freedom using the signals from the magnetic sensor system. In this embodiment, the stage is controlled using the magnetic sensor system to take off slowly with a Z trajectory motion. Next, the stage is controlled to rotate about the X, Y and Z axes using the magnetic sensor system until a good signal is received by the second sensor system. Subsequently, the second sensor system is reset. Next, the signals from the second sensor system are used to control the movement of the stage with six degrees of freedom. Subsequently, the stage moves to the center and the control system calibrates the commutation offset positions for each planar motor quadrant.

Figure 7B:
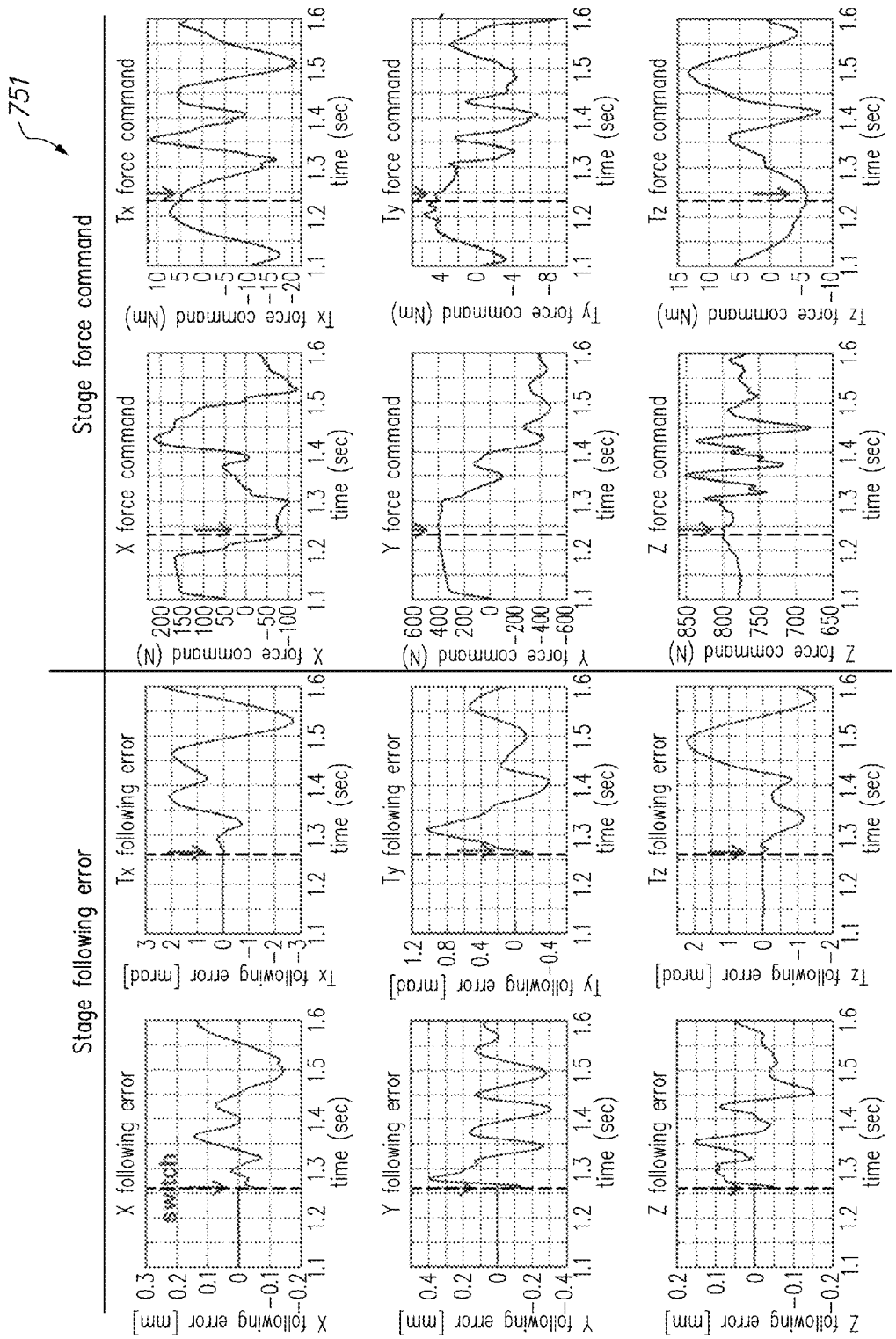
FIG. 7B includes a plurality of graphs that illustrate stage following error and stage force command during a transition from a second sensor system to the magnetic sensor system servo control.

Somewhat similarly, after calibration, during operation of the stage assembly, the magnetic sensor system can be used to control the stage mover assembly in the event the signal from the second sensor is lost. FIG. 7B includes a plurality of graphs 751 that illustrate stage following error and stage force command during a transition (switch) from the second sensor system to the magnetic sensor system servo control. As provided herein, a smooth transition is possible from the signal from the second sensor system to the magnetic sensor system. Further, smoother transition is executed without resetting control filter states while changing their parameters.

As provided herein, (i) using multiple sensors for sine and cosine waves reduce the effects of sensor XYZ positioning accuracy of the magnetic sensor system; (ii) sensor calibrations (including coil flux decoupling, gain equalization and offset removal) can be performed for each individual magnetic sensor to improve the accuracy; (iii) the phase and amplitude of sensor sine and cosine waves provides horizontal and vertical position information respectively; (iv) after individual sensor calibrations, measurement error patterns of magnet quadrant XZ or YZ positions are quite consistent at different flight heights; (v) correction maps may further reduce such measurement errors; (vi) the stage initialization works well using the magnetic sensor system; and (vii) switching from interferometer servo to Magnetic sensor servo seems to working fine.

Figure 8B:
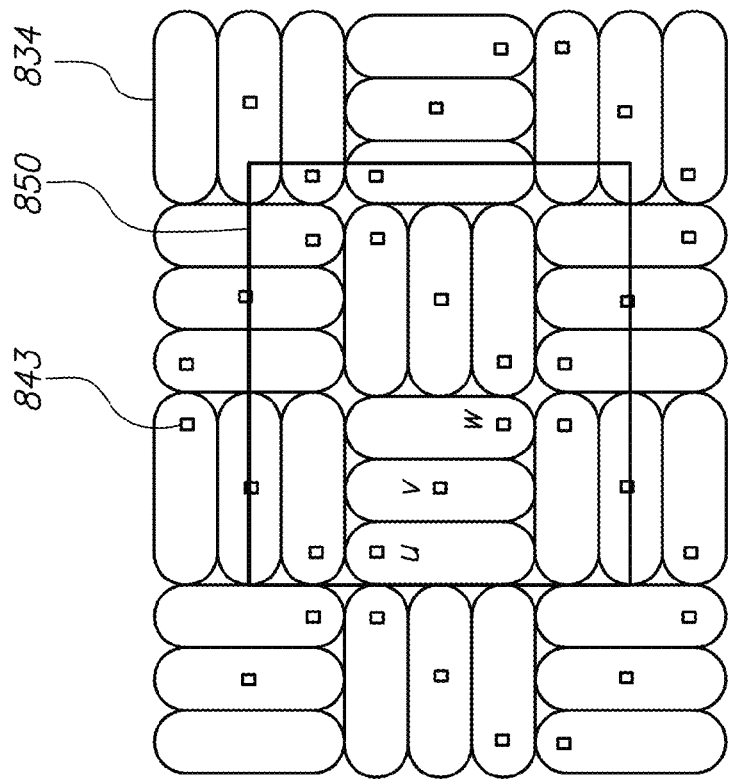
FIGS. 8A-8C illustrate alternative magnetic sensor layouts for a checkerboard coil array.
Figure 8A:
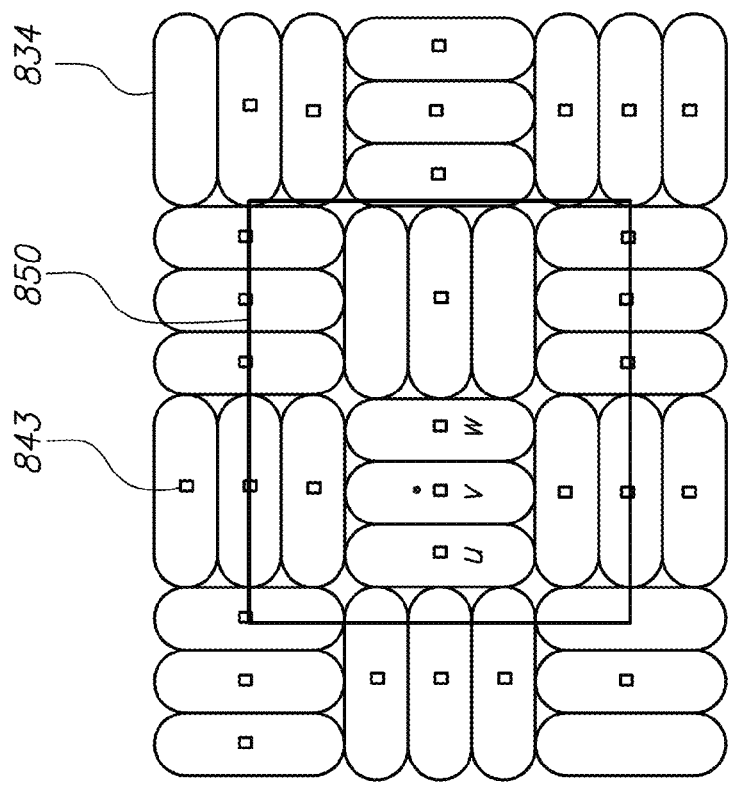
Figure 8C:
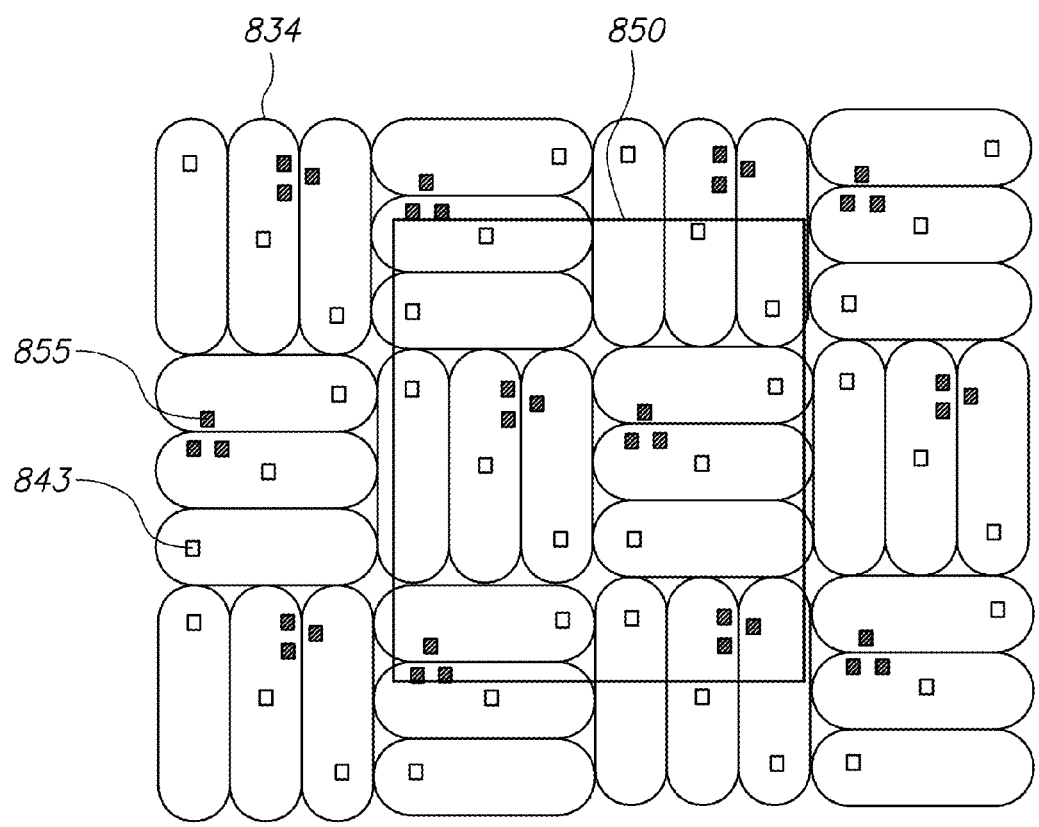

FIGS. 8A-8C illustrate alternative (non-exclusive) magnetic sensor layouts for a checkerboard coil array. In FIGS. 8A-8C, each magnetic sensor 843 is represented with a small, hollow square box and each coil 834 is represented with an oval. One magnet quadrant 850 is also illustrated in FIGS. 8A-8C with a larger, hollow square. As provided herein, to measure the stage positions, the magnetic sensors 843 do not need to be physically ninety degrees apart. In certain embodiments, the two hundred and forty degree (motor commutation where 360 degrees is North to North in the magnet array) sensor layout illustrated in FIGS. 8A, 8B and 8C leads to more uniform distributions.

It should be noted that FIG. 8C also illustrates another sensor layout. More specifically, FIG. 8C includes solid squares 855 that represent sensors 843 that are ninety degrees apart.

Figure 8D:
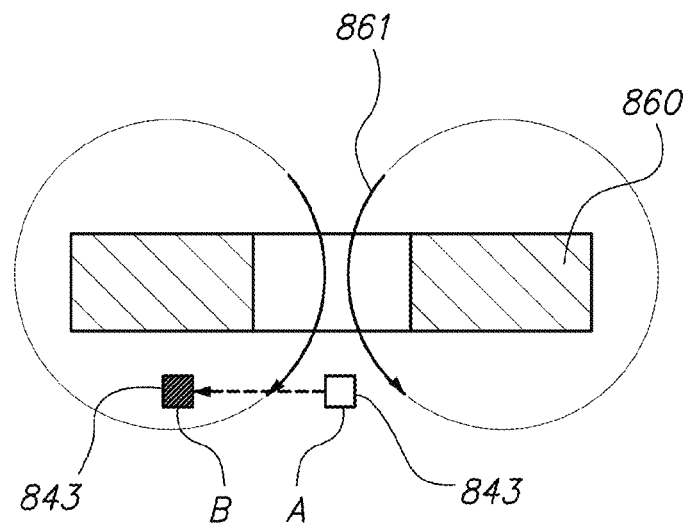
FIG. 8D includes an alternative magnetic sensor layout for a coil.

FIG. 8D includes an alternative magnetic sensor layout for a single coil 860 of a checkerboard coil array. In FIG. 8D, the coil 860 is cut-away, the magnetic sensor 843 is represented with a small square at two alternative locations. In certain embodiments, to reduce the interference of the coil flux 861 (represented with arrows) from the coil 860, the position of each magnetic sensor 843 may be moved from the center of the coil 860 (position A) to underneath the coil wires (position B) and on the opposite side of the coil 860 from the magnets. In position A, the sensor 843 is illustrated with a hollow box and in position B, the sensor 843 is illustrated with a solid box. This can reduce the influence of the coil flux 861 on the signals measured by the magnetic sensors 843. Even here there is coil flux 861, however, in certain examples, the coil flux 861 is less at this location.

Figure 8E:
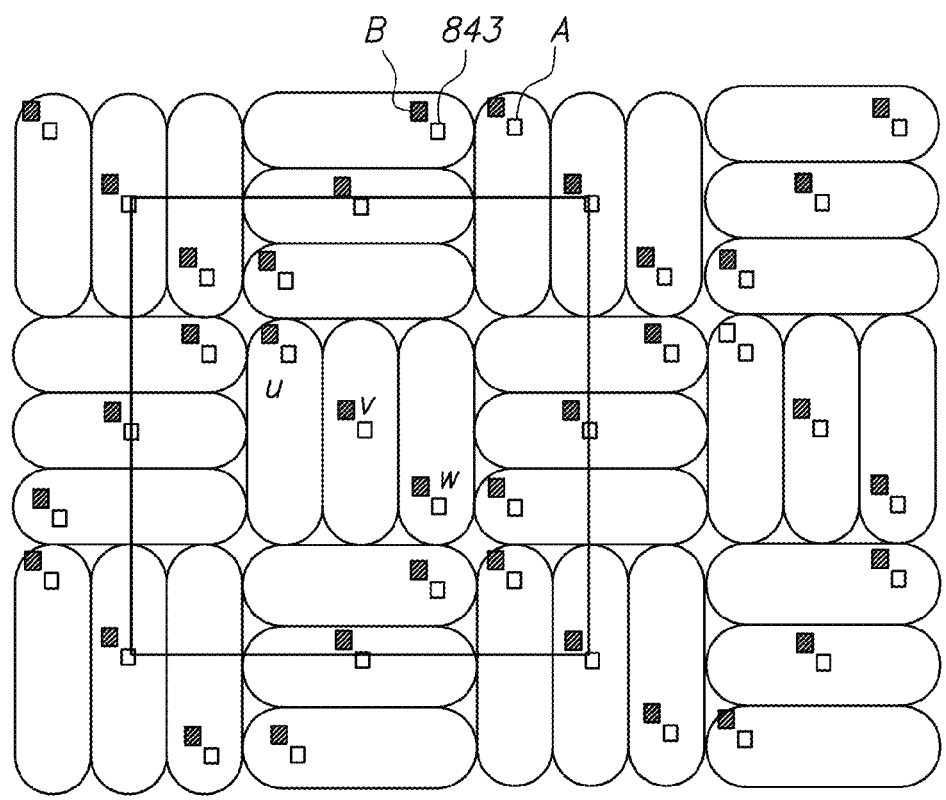
FIG. 8E illustrates yet another magnetic sensor layout for the checkerboard coil array.

FIG. 8E illustrates the resulting sensor layout for the checkerboard coil array with the magnetic sensors 843 at the first position A and the second position B. In position A, the sensor 843 is illustrated with a hollow box and in position B, the sensor 843 is illustrated with a solid box. In this example, the overall sensor layout can keep the same pattern, but that pattern is shifted slightly in the X and Y directions. It should be noted that in certain embodiments, that further calibration may still be necessary even though the location of the sensors have been shifted to remove the low-level coil flux effect on the magnetic sensor measurements.

Figure 9:
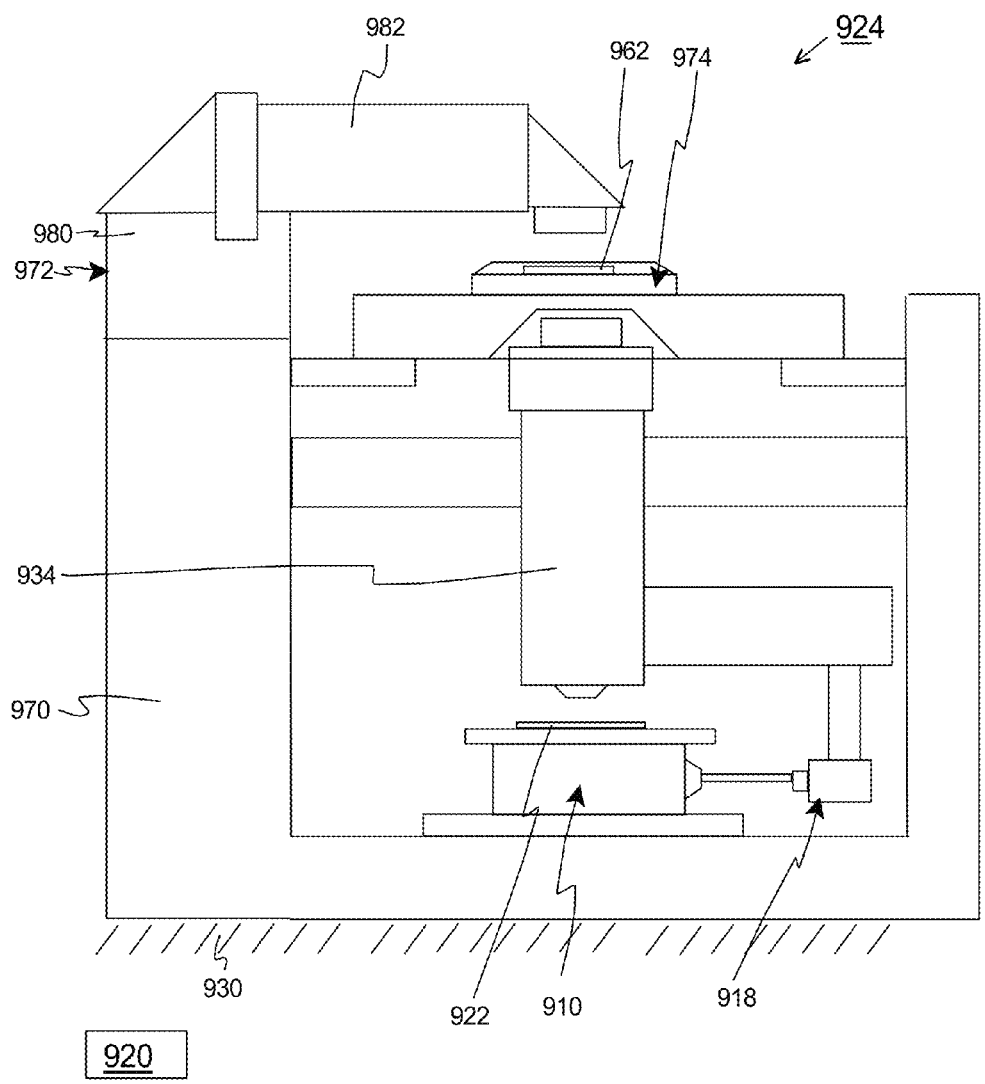
FIG. 9 is a schematic illustration of an exposure apparatus having features of the present invention.

FIG. 9 is a schematic view illustrating an exposure apparatus 924 useful with the present invention. The exposure apparatus 924 includes the apparatus frame 970, a measurement system 918 (only a portion is illustrated in FIG. 9), an illumination system 972 (irradiation apparatus), a reticle stage assembly 974, an optical assembly 934 (lens assembly), a wafer stage assembly 910, and a control system 920 that controls the reticle stage assembly 974 and the wafer stage assembly 910. The stage assemblies provided herein can be used as the wafer stage assembly 910. Alternately, with the disclosure provided herein, the stage assemblies provided herein can be modified for use as the reticle stage assembly 974.

The exposure apparatus 924 is particularly useful as a lithographic device that transfers a pattern (not shown) of an integrated circuit from the reticle 962 onto the semiconductor wafer 922. The exposure apparatus 924 mounts to the mounting base 930, e.g., the ground, a base, or floor or some other supporting structure.

The apparatus frame 970 is rigid and supports the components of the exposure apparatus 924. The design of the apparatus frame 970 can be varied to suit the design requirements for the rest of the exposure apparatus 924.

The illumination system 972 includes an illumination source 980 and an illumination optical assembly 982. The illumination source 980 emits a beam (irradiation) of light energy. The illumination optical assembly 982 guides the beam of light energy from the illumination source 980 to the reticle 962. The beam illuminates selectively different portions of the reticle 962 and exposes the semiconductor wafer 922.

The optical assembly 934 projects and/or focuses the light passing through the reticle 962 to the wafer 922. Depending upon the design of the exposure apparatus 924, the optical assembly 934 can magnify or reduce the image illuminated on the reticle 962.

The reticle stage assembly 974 holds and positions the reticle 962 relative to the optical assembly 934 and the wafer 922. Similarly, the wafer stage assembly 910 holds and positions the wafer 922 with respect to the projected image of the illuminated portions of the reticle 962.

There are a number of different types of lithographic devices. For example, the exposure apparatus 924 can be used as scanning type photolithography system that exposes the pattern from the reticle 962 onto the wafer 922 with the reticle 962 and the wafer 922 moving synchronously. Alternatively, the exposure apparatus 924 can be a step-and-repeat type photolithography system that exposes the reticle 962 while the reticle 962 and the wafer 922 are stationary.

However, the use of the exposure apparatus 924 and the stage assemblies provided herein are not limited to a photolithography system for semiconductor manufacturing. The exposure apparatus 924, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

It should be noted that the design of the measurement system can be varied pursuant to the teachings provided herein. For example, the hall sensors could be positioned in such a way as to measure X or Y or any other component of magnetic field (in the above embodiments, only the measurement of Z component of magnetic field is illustrated).

Additionally, the same principle of locating the stage with respect to a stage base, countermass, or with respect to a reference frame using hall sensors can be implemented on a moving coil stage as well (in the above embodiments, only a moving magnet stage is illustrated in the Figures).

A photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 10A:
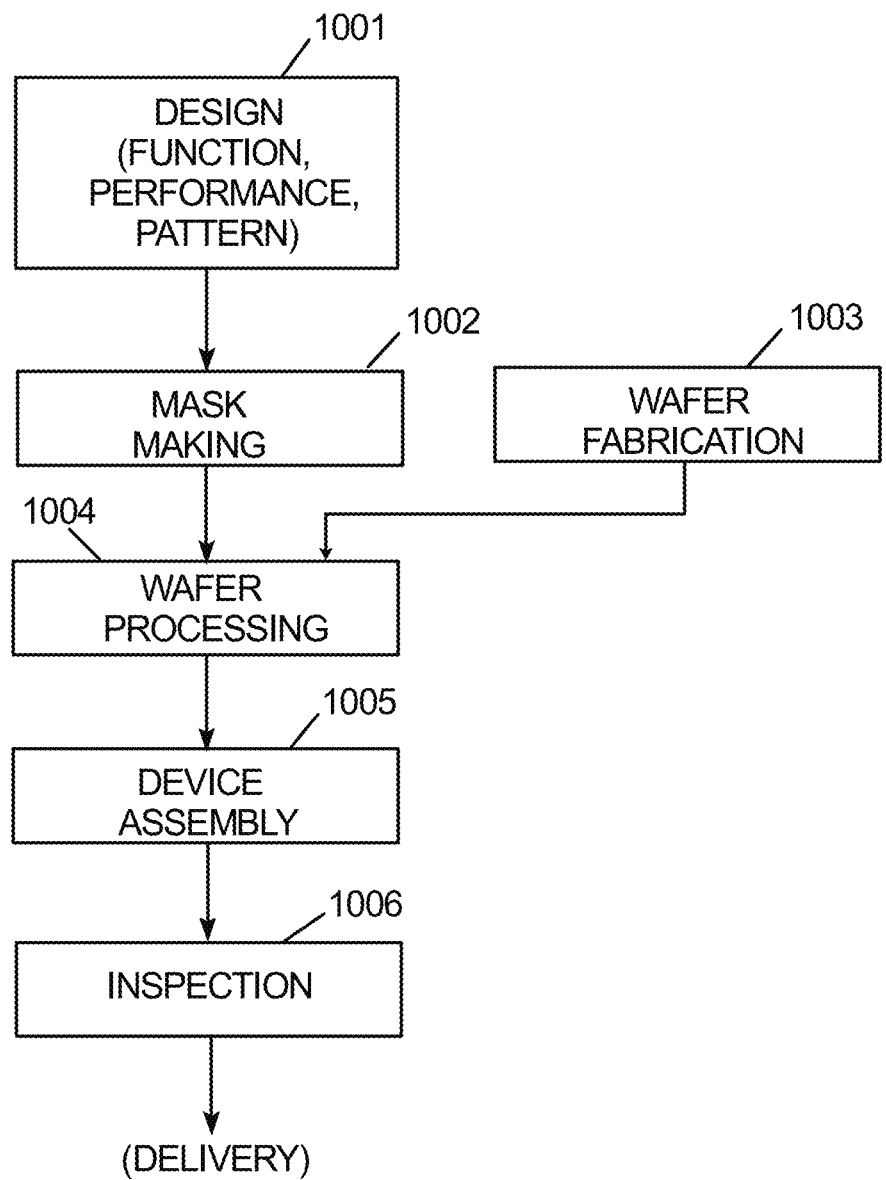
FIG. 10A is a flow chart that outlines a process for manufacturing a device in accordance with the present invention.

Further, semiconductor devices can be fabricated using the above described systems, by the process shown generally in FIG. 10A. In step 1001 the device's function and performance characteristics are designed. Next, in step 1002, a mask (reticle) having a pattern is designed according to the previous designing step, and in a parallel step 1003 a wafer is made from a silicon material. The mask pattern designed in step 1002 is exposed onto the wafer from step 1003 in step 1004 by a photolithography system described hereinabove in accordance with the present invention. In step 1005 the semiconductor device is assembled (including the dicing process, bonding process and packaging process), finally, the device is then inspected in step 1006.

Figure 10B:
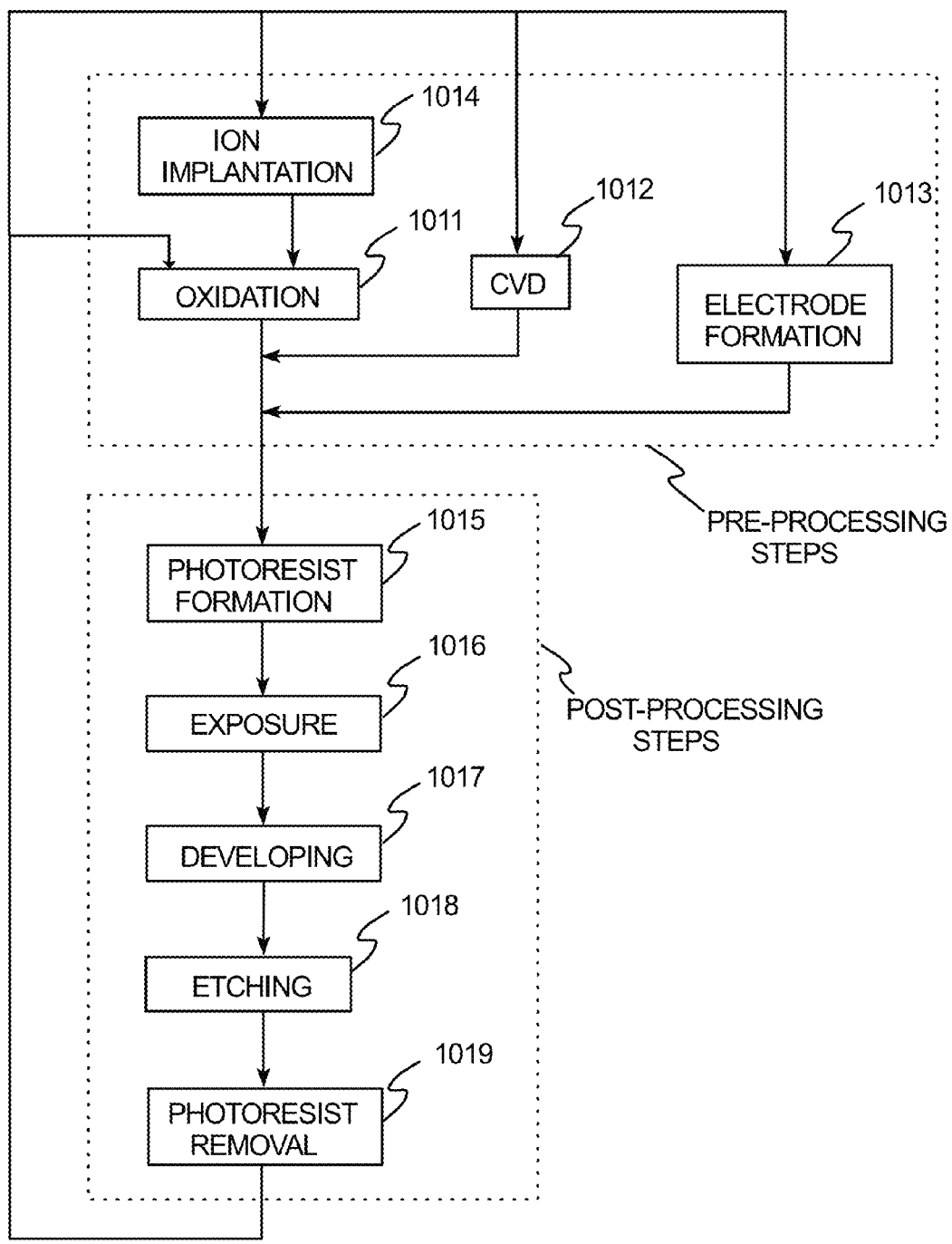
FIG. 10B is a flow chart that outlines device processing in more detail.

FIG. 10B illustrates a detailed flowchart example of the above-mentioned step 1004 in the case of fabricating semiconductor devices. In FIG. 10B, in step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1015 (photoresist formation step), photoresist is applied to a wafer. Next, in step 1016 (exposure step), the above-mentioned exposure device is used to transfer the circuit pattern of a mask (reticle) to a wafer. Then in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

While the particular stage assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly for positioning a device along a first axis, along a second axis, and along a third axis, the stage assembly comprising:
    a stage that is adapted to retain the device;
    a base;
    a mover assembly that moves the stage along the first, second and third axes relative to the base;
    a magnetic sensor system that monitors the movement of the stage along at least one of the first, second and third axes, the magnetic sensor system generating a magnetic sensor signal;
    a second sensor system that monitors the movement of the stage along the first, second and third axes, the second sensor system generating a second sensor signal; and
    a control system that controls the mover assembly using at least one of the magnetic sensor signal and the second sensor signal; wherein the control system uses the magnetic sensor signal to control the mover assembly during initialization and during a loss of the second sensor signal.

2. The stage assembly of claim 1 wherein the second sensor system is an interferometer system.

3. The stage assembly of claim 1 wherein the second sensor system is an encoder system.

4. The stage assembly of claim 1 wherein the control system utilizes the second sensor signal to calibrate the magnetic sensor signal.

5. The stage assembly of claim 1 wherein the magnetic sensor system is calibrated using at least one of the following calibrations: (i) sensor decoupling from the coil flux; (ii) sensor offset removal and gain equalization; (iii) Quadrant Z gain calibrations; and (iv) correction maps for XZ and YZ quadrant positions.

6. The stage assembly of claim 1 wherein the mover assembly is a planar motor that includes a magnet assembly that is secured to the stage and a conductor assembly that is secured to the base.

7. The stage assembly of claim 6 wherein the conductor assembly includes a plurality of coils and wherein the magnetic sensors are positioned below the coils.

8. The stage assembly of claim 7 wherein each magnetic sensor is positioned below one of the coils, offset from a center of the coil.

9. An exposure apparatus including an illumination source, and the stage assembly of claim 1 that moves the stage relative to the illumination system.

10. A process for manufacturing a device that includes the steps of providing a substrate and forming an image to the substrate with the exposure apparatus of claim 9.

11. The stage assembly of claim 1 wherein the magnetic sensor system includes a plurality of hall sensors.

12. A method for positioning a device along a first axis, along a second axis, and along a third axis, the method comprising the steps of:
providing a base;
retaining the device with a stage;
moving the stage along the first, second and third axes relative to the base with a mover assembly;
monitoring the movement of the stage along at least one of the first, second and third axes with a magnetic sensor system that generates a magnetic sensor signal;
monitoring the movement of the stage along the first, second and third axes with a second sensor system that generates a second sensor signal; and
controlling the mover assembly with a control system that uses at least one of the magnetic sensor signal and the second sensor signal; wherein the step of controlling includes the control system utilizing the magnetic sensor signal to control the mover assembly during initialization and during a loss of the second sensor signal.

13. The method of claim 12 wherein the step of controlling includes the control system utilizing the second sensor signal to calibrate the magnetic sensor signal.

14. The method of claim 13 wherein the step of controlling includes the control system calibrating the magnetic sensor using at least one of the following calibrations: (i) sensor decoupling from the coil flux; (ii) sensor offset removal and gain equalization; (iii) Quadrant Z gain calibrations; and (iv) correction maps for XZ and YZ quadrant positions.

15. The method of claim 12 wherein the step of moving includes the mover assembly having a magnet assembly that is secured to the stage and a conductor assembly that is secured to the base.

16. The method of claim 15 wherein the conductor assembly includes a plurality of coils and wherein the magnetic sensor system includes a plurality of magnetic sensors that are positioned below the coils.

17. The method of claim 16 wherein each magnetic sensor is positioned below one of the coils, offset from a center of the coil.

18. A stage assembly for positioning a device along a first axis, along a second axis, and along a third axis, the stage assembly comprising:
a stage that is adapted to retain the device;
a base;
a mover assembly that moves the stage along the first, second and third axes relative to the base;
a magnetic sensor system that monitors the movement of the stage along at least one of the first, second and third axes, the magnetic sensor system generating a magnetic sensor signal;
a second sensor system that monitors the movement of the stage along the first, second and third axes, the second sensor system generating a second sensor signal; and
a control system that controls the mover assembly using at least one of the magnetic sensor signal and the second sensor signal; and
wherein the magnetic sensor system is calibrated using at least one of the following calibrations: (i) sensor decoupling from the coil flux; (ii) sensor offset removal and gain equalization; (iii) Quadrant Z gain calibrations; and (iv) correction maps for XZ and YZ quadrant positions.

19. A method for positioning a device along a first axis, along a second axis, and along a third axis, the method comprising the steps of:
providing a base;
retaining the device with a stage;
moving the stage along the first, second and third axes relative to the base with a mover assembly;
monitoring the movement of the stage along at least one of the first, second and third axes with a magnetic sensor system that generates a magnetic sensor signal;
monitoring the movement of the stage along the first, second and third axes with a second sensor system that generates a second sensor signal; and
controlling the mover assembly with a control system that uses at least one of the magnetic sensor signal and the second sensor signal; wherein the step of controlling includes the control system calibrating the magnetic sensor system using at least one of the following calibrations: (i) sensor decoupling from the coil flux; (ii) sensor offset removal and gain equalization; (iii) Quadrant Z gain calibrations; and (iv) correction maps for XZ and YZ quadrant positions.

20. A method for positioning a device along a first axis, along a second axis, and along a third axis, the method comprising the steps of:
providing a base;
retaining the device with a stage;
moving the stage along the first, second and third axes relative to the base with a mover assembly;
monitoring the movement of the stage along each of the first, second and third axes with a magnetic sensor system that generates a magnetic sensor signal;
monitoring the movement of the stage along the first, second and third axes with a second sensor system that generates a second sensor signal; and
controlling the mover assembly with a control system that uses at least one of the magnetic sensor signal and the second sensor signal; wherein the step of controlling includes the control system utilizing the magnetic sensor signal to control the mover assembly during at least one of initialization and a loss of the second sensor signal.

21. The method of claim 20 wherein the step of monitoring the movement of the stage along each of the first, second and third axes with the magnetic sensor system includes the step of monitoring the movement of the stage along each of the first, second and third axes and about each of the first, second and third axes with the magnetic sensor system; and wherein the step of monitoring the movement of the stage along the first, second and third axes with the second sensor system includes the step of monitoring the movement of the stage along the first, second and third axes and about the first, second and third axes with the second sensor system.

22. The method of claim 20 wherein the step of controlling includes the control system utilizing the second sensor signal to calibrate the magnetic sensor signal.

23. The method of claim 20 wherein the step of moving includes the mover assembly having a magnet assembly that is secured to the stage and a conductor assembly that is secured to the base.

* * * * *